(12) United States Patent
Morishige et al.

(10) Patent No.: US 7,205,967 B2
(45) Date of Patent: Apr. 17, 2007

(54) DISPLAY APPARATUS AND DRIVE METHOD THEREFOR

(75) Inventors: Morio Morishige, Hachioji (JP); Tomoyuki Shirasaki, Higashiyamato (JP); Hiroyasu Yamada, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 466 days.

(21) Appl. No.: 10/457,093

(22) Filed: Jun. 5, 2003

(65) Prior Publication Data

US 2006/0214890 A1  Sep. 28, 2006

(30) Foreign Application Priority Data

Jun. 7, 2002 (JP) ............... 2002-166912

(51) Int. Cl.
G09G 3/30  (2006.01)

(52) U.S. Cl. .......................... 345/77; 345/76

(58) Field of Classification Search ............... 345/55, 345/76–83
See application file for complete search history.

(56) References Cited

U.S. PATENT DOCUMENTS

| | | | |
|---|---|---|---|
| 5,680,149 A * | 10/1997 | Koyama et al. ............... 345/98 |
| 6,023,259 A | 2/2000 | Howard et al. | |
| 6,091,382 A | 7/2000 | Shioya et al. | |
| 6,166,714 A | 12/2000 | Kishimoto | |
| 6,229,506 B1 | 5/2001 | Dawson et al. | |
| 6,373,454 B1 | 4/2002 | Knapp et al. | |
| 6,522,315 B2 | 2/2003 | Ozawa et al. | |
| 6,577,302 B2 | 6/2003 | Hunter et al. | |
| 6,650,060 B2 | 11/2003 | Okuda | |
| 6,734,636 B2 | 5/2004 | Sanford et al. | |
| 6,744,414 B2 * | 6/2004 | Lee et al. ............... 345/76 |
| 6,788,003 B2 | 9/2004 | Inukai et al. | |
| 6,900,784 B2 | 5/2005 | Tsuchida | |
| 6,943,759 B2 | 9/2005 | Tam | |
| 2001/0017618 A1 | 8/2001 | Azami | |
| 2001/0035863 A1 | 11/2001 | Kimura | |
| 2001/0052606 A1 | 12/2001 | Sempel et al. | |
| 2002/0014852 A1 | 2/2002 | Bae | |
| 2002/0075208 A1 * | 6/2002 | Bae et al. ............... 345/76 |
| 2002/0135309 A1 | 9/2002 | Okuda | |
| 2002/0163514 A1 | 11/2002 | Nagai | |
| 2002/0195968 A1 * | 12/2002 | Sanford et al. ............ 315/169.3 |
| 2003/0020335 A1 | 1/2003 | Komiya | |

(Continued)

FOREIGN PATENT DOCUMENTS

EP  1 146 501 A1  10/2001

(Continued)

Primary Examiner—Sumati Lefkowitz
Assistant Examiner—Ke Xiao
(74) Attorney, Agent, or Firm—Frishauf, Holtz, Goodman & Chick, P.C.

(57) ABSTRACT

Disclosed is a high-definition display apparatus which allows a write current having an adequate value to flow. The display apparatus comprises a plurality of signal lines, a plurality of optical elements which presents display as a drive current equal in value to a write current flowing in the signal lines flows, and a current control driver which is connected to one ends of the signal lines, reduces the current value of a gradation signal by a current reduction ratio and lets the write current flow in the signal lines.

26 Claims, 10 Drawing Sheets

U.S. PATENT DOCUMENTS

| | | |
|---|---|---|
| 2003/0098708 A1 | 5/2003 | Matsueda |
| 2004/0036664 A1 | 2/2004 | Miyazawa |
| 2004/0113873 A1 | 6/2004 | Shirasaki et al. |
| 2004/0165003 A1 | 8/2004 | Shirasaki |
| 2004/0183791 A1 | 9/2004 | Yoshida et al. |
| 2004/0246241 A1 | 12/2004 | Sato et al. |
| 2004/0256617 A1 | 12/2004 | Yamada et al. |
| 2005/0140610 A1* | 6/2005 | Smith et al. .......... 345/77 |
| 2005/0157581 A1 | 7/2005 | Shiurasaki et al. |
| 2005/0219168 A1 | 10/2005 | Shirasaki et al. |

FOREIGN PATENT DOCUMENTS

| | | |
|---|---|---|
| EP | 1 170 718 A1 | 1/2002 |
| EP | 1 372 136 A1 | 12/2003 |
| EP | 1 443 483 A2 | 8/2004 |
| JP | 01-123292 A | 5/1989 |
| JP | 8-330600 A | 12/1996 |
| JP | 11-143429 A | 5/1999 |
| JP | 2000-221942 A | 8/2000 |
| JP | 2001-147659 A | 5/2001 |
| JP | 2002-215095 A | 7/2002 |
| JP | 2003-529805 A | 10/2003 |
| KR | 2000-0071301 A | 11/2000 |
| WO | WO 99/65011 A2 | 12/1999 |
| WO | WO 01/20591 A1 | 3/2001 |
| WO | WO 01/75852 A1 | 10/2001 |
| WO | WO 03/058328 A1 | 7/2003 |
| WO | WO 2004/001714 A1 | 12/2003 |

* cited by examiner

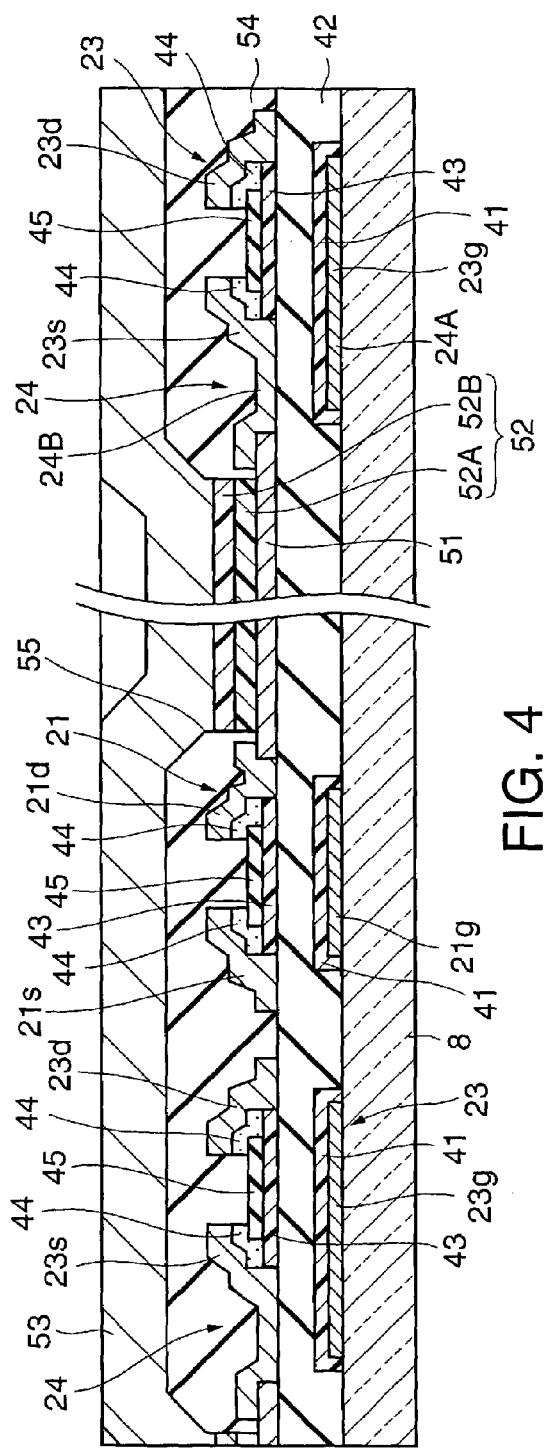
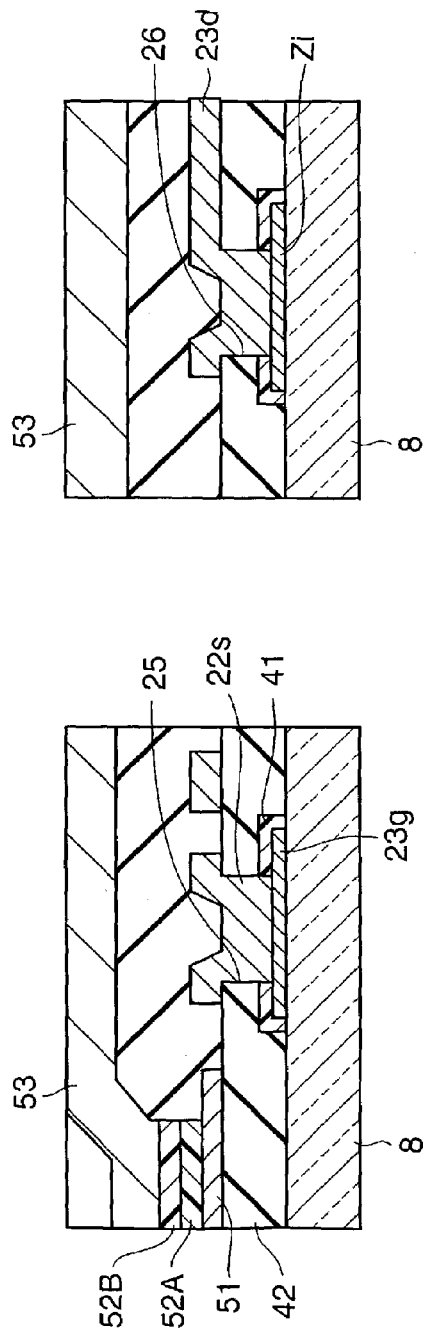
FIG. 4
FIG. 6
FIG. 5

DISPLAY APPARATUS AND DRIVE METHOD THEREFOR

BACKGROUND OF THE INVENTION

1. Field of the Invention

The present invention relates to a display apparatus equipped with optical elements, pixel by pixel, which perform an optical operation according to a current value, particularly, optical elements which emit light with a brightness according to the current value, and a drive method for the display apparatus.

2. Description of the Related Art

In general, there are two types of display apparatuses: a passive driving type and an active matrix driving type which has switching transistors provided pixel by pixel. In a liquid crystal display of the active matrix driving type, as shown in FIG. 11, a liquid crystal element 501 having a liquid crystal which also serves as a capacitor, and a transistor 502 which serves as a switching element are provided for each pixel. In the active matrix driving type, when a data driver applies a voltage for controlling the transmittivity of the liquid crystal to a signal line 504 while a scan line 503 is selected in a select period as a pulse signal is input to the scan line 503 by a scan driver, a voltage is applied to the liquid crystal element 501 via the transistor 502. In the liquid crystal element 501, liquid crystal molecules are aligned in the direction according to the applied voltage to adequately change the transmittivity of light which passes the liquid crystal element 501. Even if the transistor 502 is turned off in a non-select period following the select period, however, the liquid crystal element 501 serves as a capacitor to hold charges according to the invention the voltage value in the allowable range until the next select period, the alignment direction of the liquid crystal molecules is maintained over that period. As apparent from the above, the liquid crystal display is a voltage-controlled type display apparatus in which a voltage is newly written in the select period in such a way that the light transmittivity becomes that of the liquid crystal element 501 and which provides arbitrary gradation expression according to the voltage value.

Unlike the liquid crystal display, a display apparatus that uses an organic EL (Electroluminescence) element which is a self light-emitting element requires no backlight and is optimal for ensuring a flatter display and is free of the restriction on the angle of visibility that the liquid crystal display has. In this respect, this organic EL type display apparatus is promising as the next generation of the display apparatus and its practical usage is greatly expected.

From the view points of high luminance or brightness, high contrast and high definition, it is particularly desirable that the organic EL display, like the liquid crystal display, should be of the active matrix driving type. While a passive driving organic EL display requires that the current flowing in the select period should be increased, an active matrix driving type is provided, for each pixel, with an element for holding the voltage applied across both ends of an organic EL element in order to allow the organic EL element to keep emitting light with a predetermined brightness for light emission even in a non-select period, thus ensuring continuous flow of the current even in the non-select period. Therefore, the value of the current that flows in the organic EL element per unit time in the select period and non-select period could be small. Because the organic EL element has a very small capacitance as a capacitor, however, the organic EL element, when merely provided in the pixel circuit as shown in FIG. 11 in place of the liquid crystal element 501, cannot keep emitting light until the non-select period.

As one example of solutions to this shortcoming, as shown in FIG. 12, an active matrix driving type organic EL display is provided, for each pixel, with an organic EL element 601 which emits light with a brightness proportional to the value of the current flowing inside, a transistor 602 which serves as a switching element and a transistor 605 which allows the drive current according to the gate voltage applied by the transistor 602 to flow in the organic EL element 601. In this display, when a signal voltage for letting the drive current having a predetermined current value flow to the transistor 605 is applied to a signal line 604 by the data driver while a pixel connected to a scan line 603 is selected as a pulse signal is input to the scan line 603 in the select period by the scan driver, the voltage is applied to the gate electrode of the transistor 605 and brightness data is written in the gate electrode of the transistor 605. This sets the transistor 605 on so that the drive current with the gradation according to the invention the value of the voltage applied to the gate electrode flows into the organic EL element 601 via the transistor 605 from a power supply and the organic EL element 601 emits light with the brightness according to the current value. In the non-select period following the select period, even when the transistor 602 is turned off, charges according to the gate-source voltage of the transistor 5605 are kept stored by the parasitic capacitor or the like between the gate and source of the transistor 605, thus keeping supplying the drive current to the organic EL element 601. In short, the drive current is specifically controlled by the value of the gate voltage of the transistor which is output in the select period so that the organic EL element 601 is allowed to emit light with a predetermined gradation brightnesses.

Generally, as the channel resistance of a transistor depends on the ambient temperature or varies over a long usage, the gate threshold voltage changes with time or varies. Even if the value of the current flowing in the organic EL element 601 is changed by changing the voltage to be applied to the gate electrode of the transistor 605, i.e., even if the brightness of the organic EL element 601 is changed changing the voltage to be applied to the gate electrode of the transistor 605, therefore, it is difficult to specifically write the value of the current flowing in the organic EL element 601 with the gate voltage of the transistor 605.

In this respect, a study has been made on a scheme for controlling the brightness based on the current value, not based on the level of the voltage to be applied to the transistor. That is, a current-writing system to directly supply the value of the current flowing in an organic EL element to a signal line, not a voltage-writing system which supplies the level of the gate voltage to a signal line, is adapted to the active matrix driving for an organic EL display.

In the current-writing display, the value of the current that flows per unit time should be made smaller. In case where the current-writing system is adapted to an active matrix driving organic EL display, therefore, an organic EL display provided with a transistor which reduces the value of the current flowing into the organic EL element with respect to the output current from the driver as shown in FIG. 13 has been proposed. For each pixel, the organic EL display in FIG. 13 is provided with an organic EL element 701, an N type MOS transistor 702 and a P type MOS transistor 707 which serve as switching elements, a P type MOS transistor 706 which converts the value of a write current to a gate voltage, a capacitor 709 which holds charges according to the gate voltage of the transistor 706 and a P type MOS transistor 705 which lets a drive current with the gradation according to the held charges flow into the organic EL element 701.

In this display, as the write current is allowed to flow in a signal line 704 by the data driver while the transistors 707 and 702 are selected by signals output onto a first scan line 708 and a second scan line 703, a voltage is produced between the gate and source of the transistor 706 and the current according to the channel characteristic of the transistor 705 and the channel characteristic of the transistor 706 flows into the transistor 705 and the organic EL element 701.

The organic EL display in FIG. 13 should have however been provided with a current mirror circuit comprised of the transistors 705 and 706 for each pixel, and the increase in the number of pixels made the production yield of displays lower due to defects in the transistors 705 and 706. When the transistors 705 and 706 and the organic EL element 701 are laid out two-dimensionally, the ratio of the area of the non-luminous area, such as a transistor, of the pixel to the area of the luminous area increases, so that a burden is put on the organic EL element 701 to ensure bright display. To supply the current to an element, such as an organic EL element, which emits light on a minute current, in particular, the transistor 706 should have been designed larger with respect to the transistor 705, resulting in a considerable increase in the ratio of the non-luminous area to the luminous area. There had occurred an additional problem such that the probability of occurrence of an in-plane variation in the current characteristics of the transistors 705 and 706 which serve as a current mirror circuit would become higher in proportional to an increase in the number of pixels. Further, while the transistor 702 is an N channel transistor, the other transistors 705 to 707 are P channel transistors. This necessitates that different channel types of transistors should be fabricated, thus lowering the throughput.

One advantage of the invention lies in that the display can emit light on a current with the adequate current value and the ratio of the luminous area to the non-luminous area is high, and another advantage lies in that the display has a structure which is easy to manufacture.

SUMMARY OF THE INVENTION

To overcome the aforementioned problems, a display apparatus according to one aspect of the invention comprises:

a plurality of pixels respectively laid out at intersections of plural scan lines and plural signal lines in a display area and each having an optical element which performs an optical operation based on a current value of a drive current flowing therethrough and a pixel circuit which supplies the drive current to the optical element; and a current control driver which is arranged in an other area than the display area, is connected to each of the signal lines and reduces a current value of a gradation signal by a predetermined current reduction ratio to supply the drive current to the optical element.

As the current control driver is laid outside the display area in the invention, it is unnecessary to arrange a current control element within a pixel, thus making it possible to increase the ratio of the luminous portion to the non-luminous portion.

When an organic EL element which should emit light on an extremely minute current is used as an optical element, for example, the current value should be made very small and a change in current value originated from a gradation difference should be made very small in order to provide the organic EL element with the luminous gradation. According to the invention, by way of contrast, the provision of the current control driver can efficiently convert the gradation current to a current with a minute current value.

The apparent brightness of a pixel is expressed by the ratio of the area of an optical element in the pixel whose brightness is modulated and the product of the brightness of the pixel per unit time and the brightness sustain period of the pixel. In case where the optical element appears to display with a predetermined brightness, if the brightness sustain period of the pixel is short, the brightness of the pixel per unit time should be increased, whereas if the brightness sustain period of the pixel is long, the brightness of the pixel per unit time should be decreased. In a passive driving, voltage-controlled type organic EL display apparatus, such as a conventional simple matrix type, for example, the greater the number of pixels gets, the higher the ratio of the non-select period to the select period (i.e., the luminous period) becomes, so that the luminous brightness per unit time should be increased. In case where the display apparatus is an active driving type, however, the greater the number of pixels gets, the higher the ratio of the non-select period (luminous period) to the select period becomes. Contrary to the passive driving display apparatus, therefore, the active driving display apparatus should make the value of the current flowing into the optical element per unit time very small. The invention is particularly effective in such a case because it can supply a sufficiently minute current which meets the requirements on such a high-definition active display apparatus. Further, as the current control driver is laid outside the display area according to the invention, the ratio of the area of the optical element where the brightness of a pixel is modulated is high. It is therefore possible to restrain the deterioration of the optical element by suppressing the current density of the current flowing in the optical element per unit area to a low level, thus ensuring a longer life of the display apparatus. The invention is particularly effective when the optical element is an organic EL element in which case as the current density gets higher, the luminous life becomes considerably shorter.

A display apparatus according to another aspect of the invention comprises:

a plurality of signal lines;

a plurality of pixels each having an optical element which performs an optical operation based on a value of a drive current flowing therethrough and connected to one ends of the plurality of signal lines; and a current control driver which is connected to other ends of the plurality of signal lines and reduces a current value of a gradation signal by a predetermined current reduction ratio and lets a write current flow in the signal lines.

In the display apparatus according to the second aspect of the invention, plural pixels are provided on one end side of a plurality of signal lines and the current control driver is provided on the other end side, the pixels and the current control driver can be set apart from each other and the layout area of the optical element in each pixel is not restricted by the current control driver.

A display apparatus according to a further aspect of the invention comprises:

a optical element which has a pair of electrodes and demonstrates an optical operation according to a current flowing between the pair of electrodes;

a first switching element having a control terminal and a current path whose one end is connected to one of the pair of electrodes of the optical element so that a current with a value according to a voltage between the control terminal and the one end of the current path flows in the current path;

a power supply line which is connected to the other end of the current path of the first switching element and on which a power supply signal for allowing a drive current to flow in the optical element is output;

a scan line on which a scan signal for selecting the optical element is output;

a signal line in which a write current flows from the power supply line via the current path of the first switching element;

a second switching element which controls a voltage to be applied to the control terminal of the first switching element in accordance with the scan signal on the scan line;

a third switching element which controls a current flowing in the signal line in accordance with the scan signal in the scan line;

a capacitor which holds a voltage between the control terminal of the first switching element and the one end of the current path of the first switching element; and a current control driver which allows the write current obtained by reducing a current value of a gradation signal by a predetermined current reduction ratio to flow in the signal line.

Even in a display apparatus in which the current control active element for an optical element is constituted by using the first switching element, the second switching element and the third switching element, as apparent from the above, the provision of the current control driver which allows the write current to flow in the signal line can bring about an advantage of securing the layout area of the optical element more effectively. Because the first switching element, the second switching element and the third switching element can be driven even if they are N channel transistors, amorphous silicon TFTs for which a P channel transistor with a sufficient effective speed has not been achieved can be adapted, which makes the manufacture of the display apparatus easier.

A drive method for display apparatus according to a different aspect of the invention comprises:

a current-writing step of allowing a write current obtained by reducing a current value of a gradation signal by a predetermined current reduction ratio to flow to a plurality of pixels via a plurality of signal lines; and a drive current step of allowing a drive current equal in value to the write current to optical elements of the plurality of pixels.

Because the write current whose value is smaller than the current value of the gradation signal of image data flows into the signal line in the invention, a circuit which modulates the current to a minute current need not be provided in a pixel.

BRIEF DESCRIPTION OF THE DRAWINGS

FIG. 4 is a cross-sectional view along line IV—IV in FIG. 3;

FIG. 5 is a cross-sectional view along line V—V in FIG. 3;

FIG. 6 is a cross-sectional view along line VI—VI in FIG. 3;

DETAILED DESCRIPTION OF THE PREFERRED EMBODIMENTS

The following will describe specific modes of the invention referring to the accompanying drawings. It is to be noted however that the scope of the invention is not limited to the illustrated examples.

First Embodiment

Figure 1:
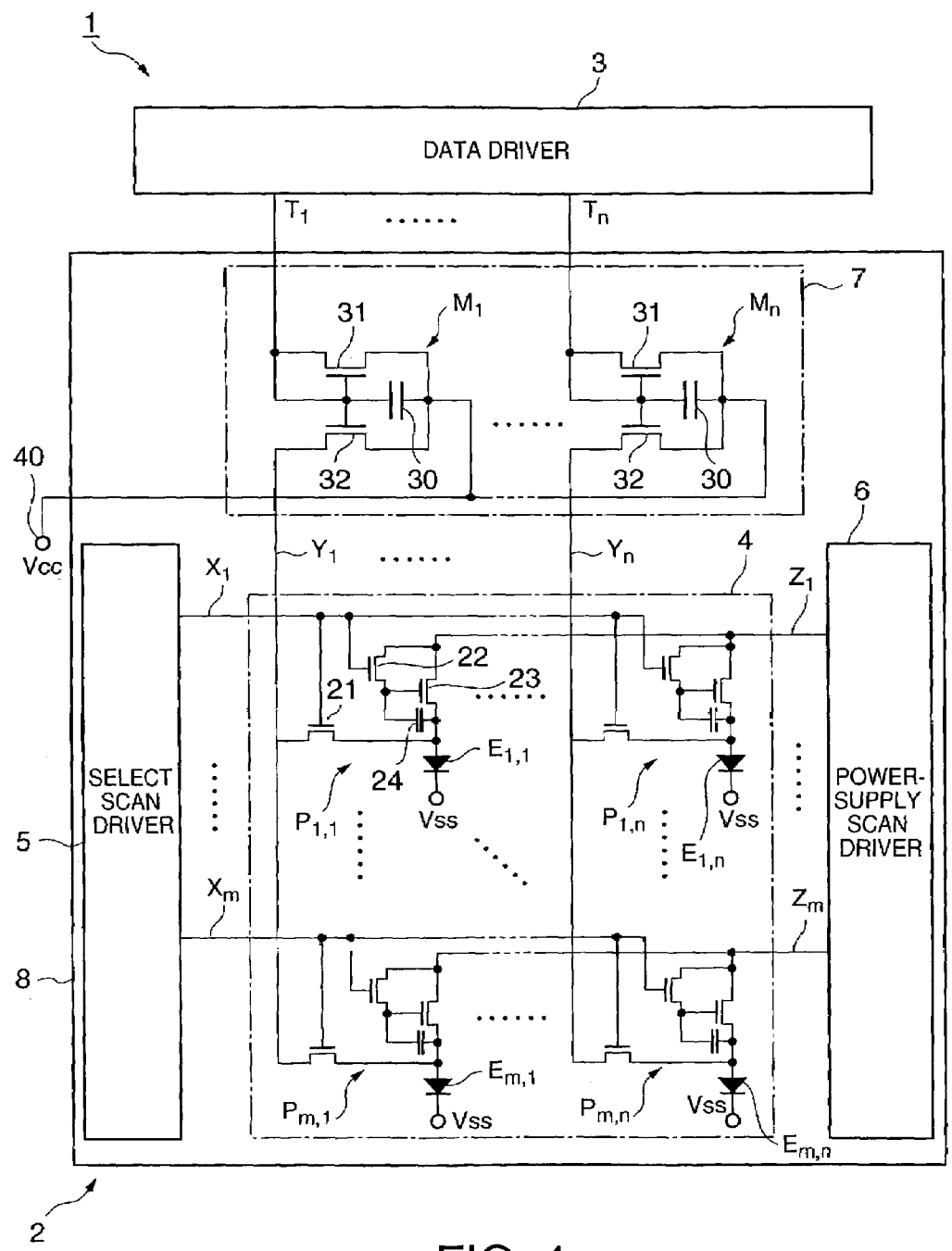
FIG. 1 is a circuit diagram illustrating a specific mode of a display apparatus to which the invention is adapted.

FIG. 1 is a circuit diagram illustrating a display apparatus to which the invention is adapted. As shown in FIG. 1, the basic structure of the display apparatus 1 has an organic EL display panel 2 which provides color display by an active matrix driving system, and a data driver (gradation signal output means) 3 which outputs gradation signals, represented by current values corresponding to the gradations of image data, to the organic EL display panel 2 in parallel.

The organic EL display panel 2 has a basic structure that includes a transparent substrate 8, a display section 4 or the display area on which an image is substantially displayed, a select scan driver 5 provided around the display section 4 or in the non-display area, a power-supply scan driver 6 and a current conversion section 7. Those circuits 4 to 7 are formed on the transparent substrate 8. A current control driver has the current conversion section 7 and the data driver 3.

In the display section 4, (m×n) pixels $P_{1,1}$ to $P_{m,n}$ (m and n being arbitrary natural numbers) are provided on the transparent substrate 8 in a matrix form, m pixels $P_{1,j}$ to $P_{m,j}$ (j being an arbitrary natural number and $1 \leq j \leq n$) laid out in the column direction or the vertical direction while n pixels $P_{i,1}$ to $P_{i,n}$ (i being an arbitrary natural number and $1 \leq i \leq m$) are laid out in the row direction or the horizontal direction. That is, the pixel $P_{i,j}$ is the pixel that is the i-th one (i.e., the i-th row) from the top in the vertical direction and is the j-th one (i.e., the j-th column) from the left in the horizontal direction.

In the display section 4, m select scan lines $X_1$ to $X_m$ arrayed along the row direction are provided on the transparent substrate 8 in parallel in the column direction. Further, m power-supply scan lines $Z_1$ to $Z_m$ arrayed along the row direction are provided on the transparent substrate 8 in parallel in the column direction in association with the respective select scan lines $X_1$ to $X_m$. Each power-supply scan line $Z_k$ ($1 \leq k \leq m-1$) is laid between the select scan line $X_k$ and the select scan line $X_k+1$ and the select scan line $X_m$ is laid between the power-supply scan line $Z_{m-1}$ and the power-supply scan line $Z_m$. Further, n signal lines $Y_1$ to $Y_n$ arrayed along the column direction are provided on the transparent substrate 8 in parallel in the row direction. Those select scan lines $X_1$ to $X_m$, the power-supply scan lines $Z_1$ to $Z_m$ and the signal lines $Y_1$ to $Y_n$ are insulated from one another by respective intervening insulating films. The select scan line $X_1$ and the power-supply scan line $Z_1$ are connected to the n pixels $P_{i,1}$ to $P_{i,n}$ laid out in the row direction, the m pixels $P_{1,j}$ to $P_{m,j}$ laid out in the column direction are connected to the signal line $Y_j$, and the pixel $P_{i,j}$ is located in an area surrounded by the select scan line $X_i$, the power-supply scan line $Z_i$ and the signal line $Y_j$.

Figure 2:
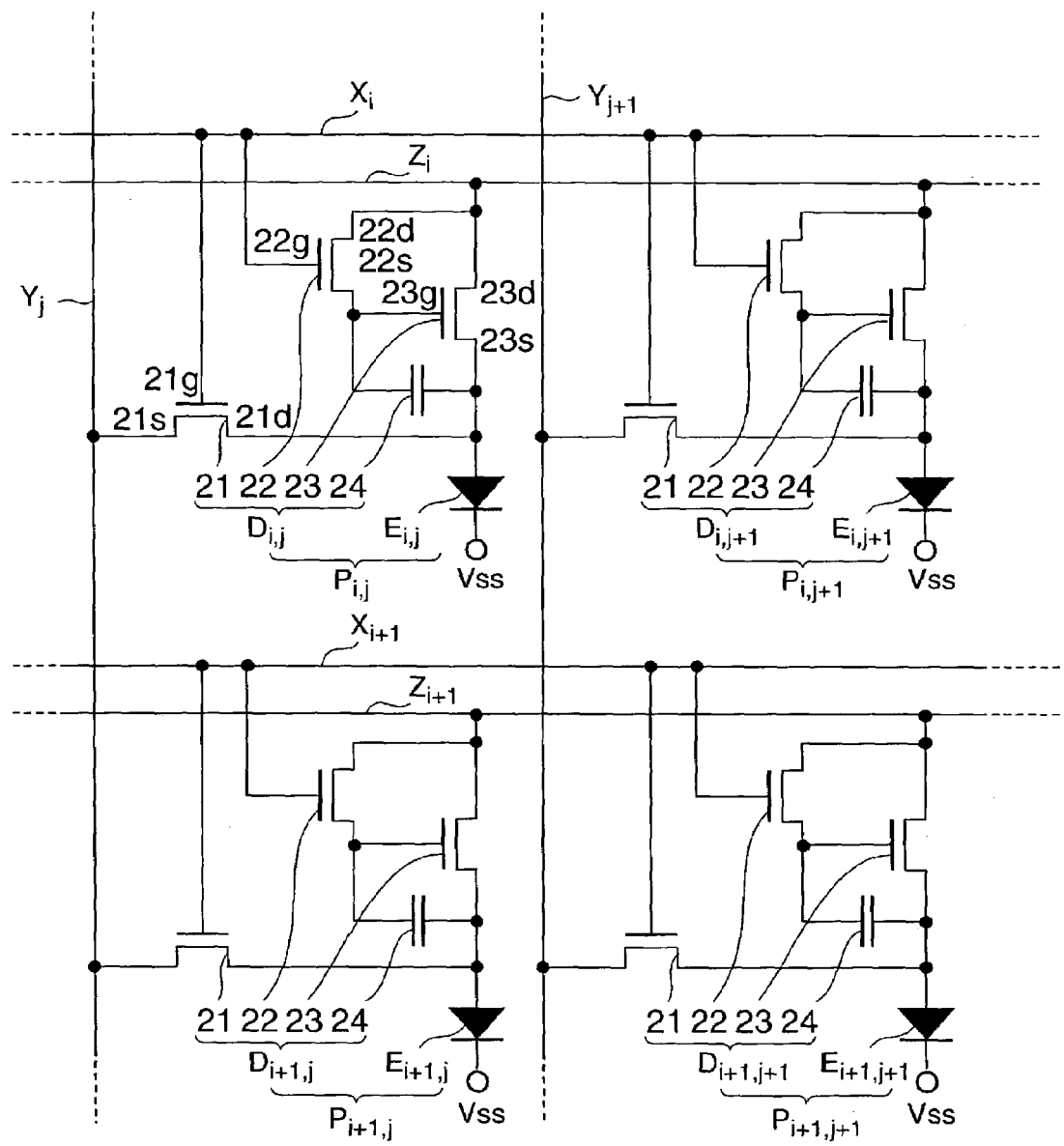
FIG. 2 is a circuit diagram showing a plurality of pixels laid out in a matrix form.
Figure 3:
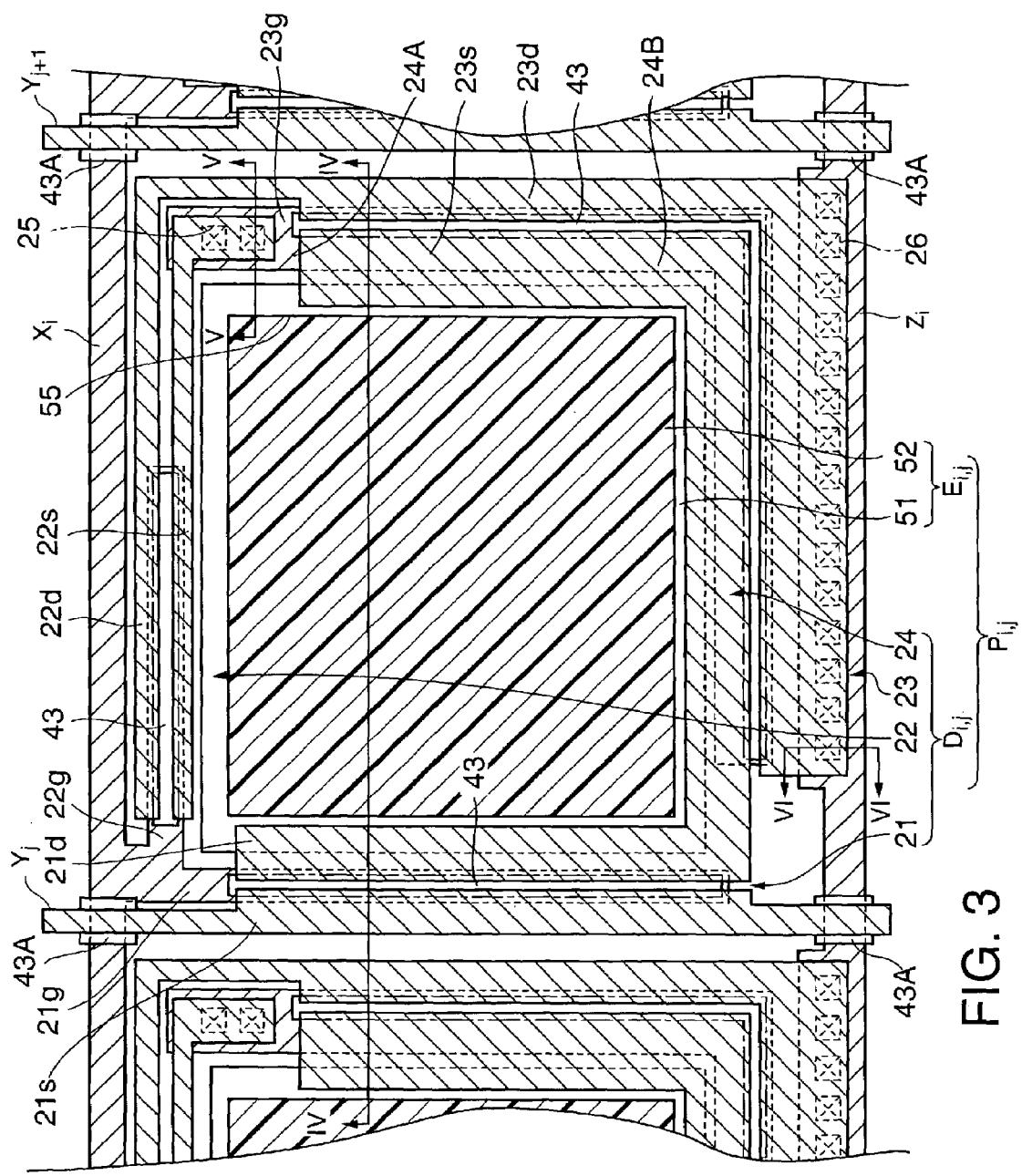
FIG. 3 is an approximately plan view showing the pixels in FIG. 2.

Each pixel $P_{i,j}$ will be discussed next referring to FIGS. 2 to 6. FIG. 2 is an equivalent circuit diagram of four adjoining pixels $P_{i,j}$, $P_{i+1,j}$, $P_{i,j+1}$ and $P_{i+1,j+1}$. FIG. 3 is a plan view showing the pixel $P_{i,j}$ and does not show an oxide insulating film 41, a channel protection insulating film 45, a common electrode 53 and so forth, which will be discussed later, for easier understanding. FIG. 4 is a cross-sectional view along line IV—IV in FIG. 3, FIG. 5 is a cross-sectional view along line V—V in FIG. 3 and FIG. 6 is a cross-sectional view along line VI—VI in FIG. 3.

The pixel $P_{i,j}$ comprises an organic EL element $E_{i,j}$ which emits light, and a pixel circuit $D_{i,j}$ which is provided around the organic EL element $E_{i,j}$ and is comprised of an active element to drive the organic EL element $E_{i,j}$. The pixel circuit $D_{i,j}$ keeps the luminous brightness of the organic EL element $E_{i,j}$ constant for a predetermined period of time by holding the value of the current that flows through the organic EL element $E_{i,j}$ during a given luminous period based on signals output from the data driver 3, the select scan driver 5 and the power-supply scan driver 6.

The organic EL element $E_{i,j}$ has a lamination structure comprising a pixel electrode 51, an organic EL layer 52 and a common electrode 53 laminated on the transparent substrate 8. The pixel electrode 51 serves as an anode. The organic EL layer 52 has a capability which allows holes and electrons to be injected therein by an electric field and a capability of transporting the holes and electrons. Further, the organic EL layer 52 has a recombining area which recombines transported holes and electrons and a luminous area which emits light by capturing excitons generated by recombination, and thus serves as a luminous layer in a broad sense. The common electrode 53 serves as a cathode.

The pixel electrode 51 is patterned in such a way as to be separated into segments for the respective pixels $P_{i,j}$ which are respectively surrounded by the signal lines $Y_1$ to $Y_n$ and the select scan lines $X_1$ to $X_m$. The pixel electrode 51 has its periphery covered with an interlayer insulating film 54 of silicon nitrogen or silicon oxide which covers three transistors 21, 22 and 23 of each pixel circuit $D_{i,j}$, and has its center top portion exposed through a contact hole 55 formed in the interlayer insulating film 54. The interlayer insulating film 54 may have a first layer of silicon nitrogen or silicon oxide and a second layer comprised of an insulating film of polyimide or the like and formed on the first layer.

The pixel electrode 51 has a conductivity and a transmittivity with respect to visible light. It is preferable that the pixel electrode 51 should have a relatively high work function to efficiently inject holes into the organic EL layer 52. As an example, the pixel electrode 51 essentially consists of tin-doped indium oxide (ITO), zinc-doped indium oxide, indium oxide ($In_2O_3$), tin oxide ($SnO_2$) or zinc oxide (ZnO).

The organic EL layer 52 is deposited on each pixel electrode 51. The organic EL layer 52 is also patterned for each pixel $P_{i,j}$. While the organic EL layer 52 contains a luminous material (fluorescent substance) which is an organic compound, the luminous material may be a high polymer material or a low polymer material. The organic EL layer 52 may have, for example, a double-layer structure which comprises a hole transporting layer 52A and a luminous layer 52B in a narrow sense, which has a recombining area recombination area where electrons and holes are recombined and a luminous area that emits light by capturing excitons generated by recombination, in the named order from the pixel electrode 51, as shown in FIG. 4. Alternatively, the organic EL layer 52 may have a three-layer structure which comprises a hole transporting layer, a luminous layer in a narrow sense and an electron transporting layer arranged in the named order from the pixel electrode 51, or may have a single-layer structure comprising a luminous area in a narrow sense.

The organic EL display panel 2 can provide full color display or multi-color display in which case the organic EL layer 52 of each of the pixels $P_{i,1}$ to $P_{i,n}$ is a luminous area in a broad sense which has a capability of emitting light of, for example, red, green or blue. That is, as the individual pixels $P_{i,1}$ to $P_{i,n}$ selectively emit lights of red, green and blue, the display can have the color tone with those colors properly combined.

It is desirable that the organic EL layer 52 be of an electrically neutral organic compound, so that holes and electrons are injected and transported in a well-balanced manner in the organic EL layer 52. A substance with an electron transporting capability may be adequately mixed in a luminous area in a narrow sense, a substance with a hole transporting capability may be adequately mixed in a luminous area in a narrow sense or a substance with an electron transporting capability and a substance with a hole transporting capability may be adequately mixed in a luminous area in a narrow sense. Further, a charge transporting layer which is an electron transporting layer or a hole transporting layer may be let function as a recombining area and light emission may be achieved by mixing a fluorescent substance in this charge transporting layer.

The common electrode 53 formed on the organic EL layer 52 is a single electrode connected to all the pixels $P_{1,1}$ to $P_{m,n}$. The common electrode 53 may comprise a plurality of electrodes of a stripe pattern connected column by column, such as a common electrode of a stripe pattern which connects a group of pixels $P_{1,h-1}$ to pixels $P_{m,h-1}$ (h being an arbitrary natural number and $2 \leq h \leq n$) in the column direction, a common electrode of a stripe pattern which connects a group of pixels $P_{1,h}$ to pixels $P_{m,h}$, and so forth. Alternatively, the common electrode 53 may comprise a plurality of electrodes of a stripe pattern connected row by row, such as a common electrode of a stripe pattern which connects a group of pixels $P_{g-1,1}$ to pixels $P_{g-1,n}$ (g being an arbitrary natural number and $2 \leq g \leq n$) in the row direction, a common electrode of a stripe pattern which connects a group of pixels $P_{g,1}$ to pixels $P_{g,n}$, and so forth. In either case, the common electrode 53 is electrically insulated from the select scan line $X_i$, the signal line $Y_j$ and the power-supply scan line $Z_i$. The common electrode 53 is formed of a material having a low work function, e.g., a single material or an alloy which contains at least one of indium, magnesium, calcium, lithium, barium and a rare earth metal. The common electrode 53 may take a lamination structure which has a lamination of multiple layers of the aforementioned materials; specifically, the lamination structure which has a high-purity barium layer with a low work function provided on the interface side that contacts the organic EL layer 52 and an aluminum layer provided in such a way as to cover the barium layer or the lamination structure which has a lithium layer and an aluminum layer overlying the lithium layer. In case where the pixel electrode 51 is a transparent electrode and light emitted from the organic EL layer 52 of the organic EL display panel 2 is let go out from the transparent substrate 8 via the pixel electrode 51, it is preferable that the common electrode 53 should have a light-shielding property with respect to light emitted from the organic EL layer 52 and it is more preferable that the common electrode 53 should have a high light reflectance with respect to light emitted from the organic EL layer 52.

As a forward bias voltage is applied between the pixel electrode 51 and the common electrode 53 of the organic EL element $E_{i,j}$ that has the aforementioned lamination structure, holes are injected into the organic EL layer 52 from the pixel electrode 51 and electrons are injected into the organic EL layer 52 from the common electrode 53. Then, the holes and electrons are transported in the organic EL layer 52 and are recombined in the organic EL layer 52 to generate excitons. The excitons excite the organic EL layer 52 which in turn emit light.

The luminous brightness (unit of $cd/m^2$) of the organic EL element $E_{i,j}$ depends on the value of the current that flows in the organic EL element $E_{i,j}$. To keep the luminous brightness of the organic EL element $E_{i,j}$ constant during the luminous period of the organic EL element $E_{i,j}$ or set the luminous brightness to the one that accords to the current value of a gradation signal output from the data driver 3, the pixel circuit $D_{i,j}$ which controls the current value of the organic EL element $E_{i,j}$ is provided around the organic EL element $E_{i,j}$ for each pixel $P_{i,j}$.

Each pixel circuit $D_{i,j}$ has three transistors 21, 22 and 23 each comprised of an N channel MOS field effect thin film transistor (TFT) and a capacitor 24.

Each transistor 21 is an MOS field effect transistor which comprises a gate electrode 21g, a gate insulating film 42, a semiconductor layer 43, a source electrode 21s and a drain electrode 21d, each transistor 22 is an MOS field effect transistor which comprises a gate electrode 22g, a gate insulating film 42, a semiconductor layer 43, a source electrode 22s and a drain electrode 22d, and each transistor 23 comprises a gate electrode 23g, a gate insulating film 42, a semiconductor layer 43, a source electrode 23s and a drain electrode 23d.

Specifically, as shown in FIG. 4, the transistor 21 is an inverse staggered transistor which comprises the gate electrode 21g of aluminum provided on the transparent substrate 8, the oxide insulating film 41 formed by anode oxidation of aluminum in such a way as to cover the gate electrode 21g, the gate insulating film 42 of silicon nitride or silicon oxide covering the oxide insulating film 41, the semiconductor layer 43 having an island shape formed on the gate insulating film 42, the channel protection insulating film 45 of silicon nitride formed on the semiconductor layer 43, impurity semiconductor layers 44, 44 of $n^+$ silicon respectively provided on both ends of the semiconductor layer 43, and the source electrode 21s and the drain electrode 21d, which are respectively formed on the impurity semiconductor layers 44, 44 and whose materials are selected from chromium, a chromium alloy, aluminum, an aluminum alloy or the like.

While the transistor 22 and the transistor 23 have the same structures as the transistor 21, the shapes and sizes of the transistors 21, 22 and 23, the channel width, the channel length and the like of the semiconductor layer 43 are adequately set in accordance with the functions of the transistors 21, 22 and 23.

The transistors 21, 22 and 23 may be formed simultaneously in the same process, in which case the components of each of the transistors 21, 22 and 23, such as the gate electrode, the oxide insulating film 41, the gate insulating film 42, the semiconductor layer 43, the impurity semiconductor layers 44, 44, the source electrode and drain electrode, have the same compositions as those of the other transistors.

Although the semiconductor layer 43 of the transistors 21, 22 and 23, if it is made of amorphous silicon, can be driven sufficiently, it may be of polysilicon. The structures of the transistors 21, 22 and 23 may take a staggered type or a coplanar type instead of the inverse staggered type.

Each capacitor 24 comprises an electrode 24A connected to the gate electrode 23g of the transistor 23, an electrode 24B connected to the source electrode 23s of the transistor 23, and a dielectric having the gate insulating film 42 intervened between the electrode 24A and the electrode 24B, and stores charges between the source electrode 23s and the drain electrode 23d of the transistor 23.

As shown in FIG. 2, each transistor 22 of the i-th row of pixel circuits $D_{i,1}$ to $D_{i,n}$ has the gate electrode 22g connected to the select scan line $X_i$ of the i-th row and the drain electrode 22d connected to the power-supply scan line $Z_i$ of the i-th row. The drain electrode 23d of each transistor 23 of the i-th row of pixel circuits $D_{i,1}$ to $D_{1,n}$ is connected to the power-supply scan line $Z_i$ of the i-th row. The gate electrode 21g of each transistor 21 of the i-th row of pixel circuits $D_{i,1}$ to $D_{i,n}$ is connected to the select scan line $X_i$ of the i-th row. The source electrode 21s of each transistor 21 of the j-th row of pixel circuits $D_{1,j}$ to $D_{m,j}$ is connected to the signal line $Y_j$ of the j-th column.

In each of the pixels $P_{1,1}$ to $P_{m,n}$, as shown in FIG. 5, the source electrode 22s of the transistor 22 is connected to the gate electrode 23g of the transistor 23 via a contact hole 25 formed in the gate insulating film 42 and connected to one electrode of the capacitor 24. The source electrode 23s of the transistor 23 is connected to the other electrode of the capacitor 24 and the drain electrode 21d of the transistor 21. The source electrode 23s of the transistor 23, the other electrode of the capacitor 24 and the drain electrode 21d of the transistor 21 are each connected to the pixel electrode 51 of the organic EL element $E_{i,j}$. The potential of the common electrode 53 of the organic EL element $E_{i,j}$ is a reference potential $V_{SS}$ and is set to 0 (V) in the invention as the common electrodes 53 of all the organic EL elements $E_{1,1}$ to $E_{m,n}$.

Provided between the select scan line $X_i$ and the signal line $Y_j$ and between the power-supply scan line $Z_i$ and the signal line $Y_j$ are a protection film 43A formed by patterning the same film as the semiconductor layer 43 of each of the transistors 21 to 23 in addition to the gate insulating film 42.

As shown in FIG. 1, the signal lines $Y_1$ to $Y_n$ are connected to the current conversion section 7. Specifically, the current conversion section 7 comprises current mirror circuits $M_1$ to $M_n$ which have one ends connected to the signal lines $Y_1$ to $Y_n$ and other ends connected to the data driver 3. That is, the signal line $Y_j$ of the j-th column is connected to the data driver 3 via the current mirror circuit $M_j$.

The current mirror circuit $M_j$ comprises a capacitor 30 and two MOS transistors 31 and 32. The transistors 31 and 32 will be described as N channel field effect transistors in the following description.

The gate electrode of the transistor 31 and the gate electrode of the transistor 32 are connected together to the output terminal, $T_j$, of the data driver 3 and one electrode of the capacitor 30. The drain electrode of the transistor 31 is connected to the output terminal $T_j$ of the data driver 3 and one electrode of the capacitor 30.

The drain electrode of the transistor 32 is connected to the signal line $Y_j$. The source electrode of the transistor 31 and the source electrode of the transistor 32 are connected together to the other electrode of the capacitor 30. Further, the source electrode of the transistor 31 and the source electrode of the transistor 32 are connected to a low power supply 40 of a potential $V_{CC}$ which is a constant level. The potential $V_{CC}$ of the low power supply 40 is lower than the reference potential $V_{SS}$ and is lower than a select voltage $V_{SELECT}$ of, for example, −20 V, which will be discussed later.

The transistors 31 and 32 are so set as to have a relationship given by the following equation 1.

$$W31/L31 > W32/L32 \qquad (1)$$

where W31 and L31 are the channel width and channel length of the transistor 31, and W32 and L32 are the channel width and channel length of the transistor 32. As one example, the relationship given by the equation 1 can be provided by making the channel length L31 of the transistor 31 equal to the channel length L32 of the transistor 32 and making the channel width W31 of the transistor 31 longer than the channel width W32 of the transistor 32. If the channel resistance of the transistor 32 is higher than the channel resistance of the transistor 31, the transistors 31 and 32 may have the same channel length. That is, the channel length L31 of the transistor 31 may be shorter than the channel length L32 of the transistor 32 and the channel width W31 of the transistor 31 may be equal to the channel width W32 of the transistor 32. Alternatively, the channel length L31 of the transistor 31 may be shorter than the channel length L32 of the transistor 32 and the channel width W31 of the transistor 31 may be greater than the channel width W32 of the transistor 32. This design can allow the channel resistance of the transistor 32 to be higher than the channel resistance of the transistor 31, e.g., about ten times or twenty times the channel resistance of the transistor 31.

The data driver 3 outputs gradation signals represented by current values according to the gradations of image data to the current mirror circuits $M_1$ to $M_n$ in response to a clock signal from an external circuit. As the gradation signal is output from the output terminal $T_j$ of the data driver 3, the voltage is applied to the drain electrode and the gate electrode of the transistor 31, causing the current to flow between the drain and source of the transistor 31. At this time, the current also flows between the drain and source of the transistor 32. Because the channel resistance of the transistor 32 is higher than the channel resistance of the transistor 31 and the voltage level at the gate electrode of the transistor 32 is equal to the voltage level at the gate electrode of the transistor 31, the value of the drain-source current of the transistor 32 is smaller than the value of the drain-source current of the transistor 31. Specifically, the value of the drain-source current of the transistor 32 is the ratio of the channel resistance of the transistor 32 to the channel resistance of the transistor 31 multiplied by the value of the drain-source current of the transistor 31, i.e., the product of the channel resistance ratio and the current value, so that the value of the drain-source current of the transistor 32 is proportional to the value of the drain-source current of the transistor 31 and is smaller than the value of the drain-source current of the transistor 31. It is therefore possible to easily perform gradation control on the minute current that flows in the transistor 32. The ratio of the channel resistance of the transistor 32 to the channel resistance of the transistor 31 will be hereinafter called "current reduction ratio".

The select scan lines $X_1$ to $X_m$ are connected to the select scan driver 5, and the power-supply scan lines $Z_1$ to $Z_m$ to the power-supply scan driver 6.

The select scan driver 5 is a so-called shift register. That is, based on the clock signal from the external circuit, the select scan driver 5 outputs a scan signal to the select scan lines $X_1$ to $X_m$ in order from $X_1$ to $X_m$ (the select scan line $X_\alpha$ comes next to the select scan line $X_m$) to thereby sequentially scan and select the select scan lines $X_1$ to $X_m$.

Figure 8:
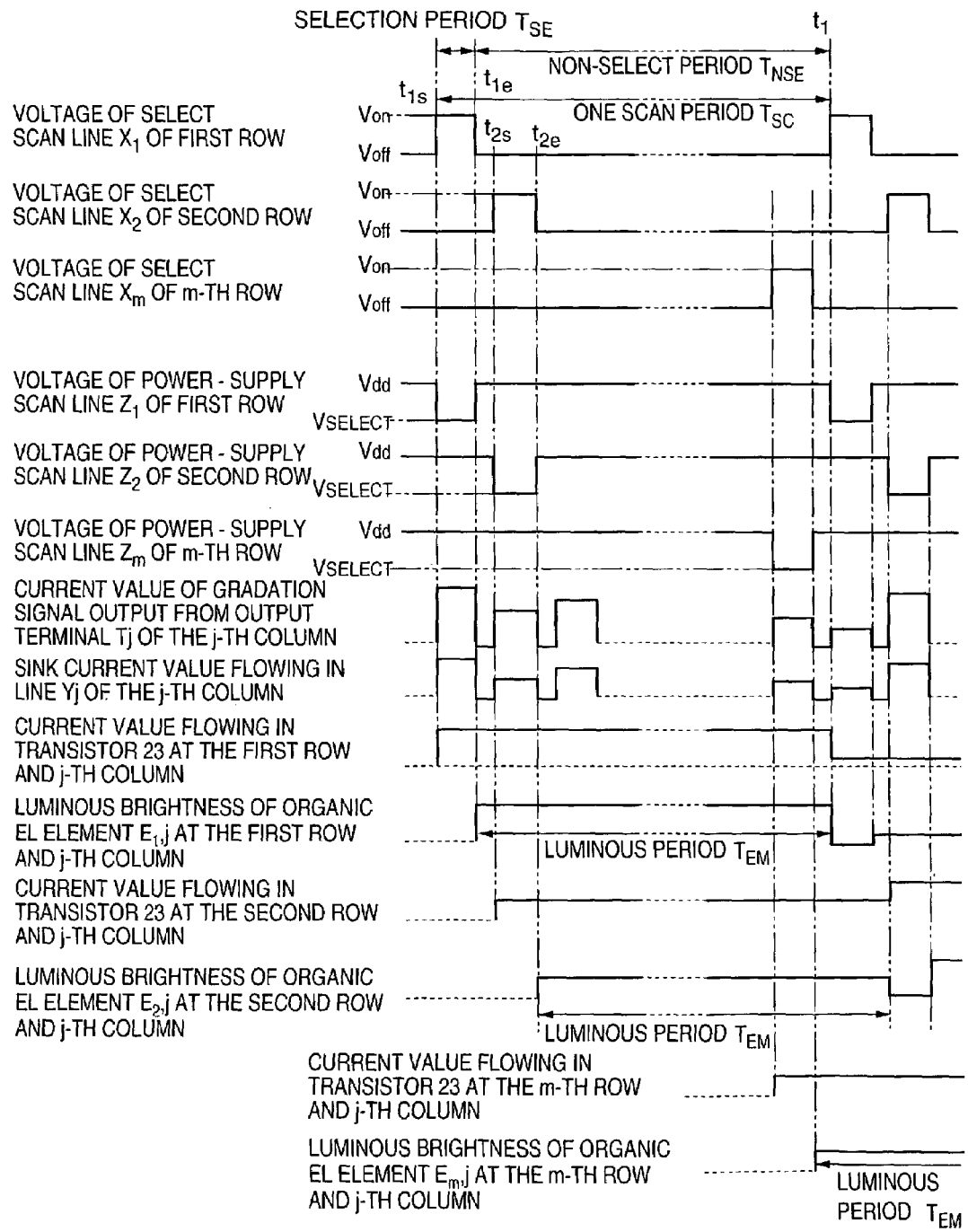
FIG. 8 is a timing chart illustrating signals in the display apparatus in FIG. 1.

In detail, as shown in FIG. 8, the select scan driver 5 outputs a high-level ON voltage $V_{on}$ (sufficiently higher than the reference potential $V_{SS}$) to set the transistors 21 and 22 on to the select scan lines $X_1$ to $X_m$ during each select period $T_{SE}$ and outputs a low-level OFF voltage $V_{off}$ (equal to or lower than the reference potential $V_{SS}$) to set the transistors 21 and 22 off to the select scan lines $X_1$ to $X_m$ during each non-select period $T_{NSE}$. For each of the select scan lines $X_1$ to $X_m$, the select period and the select period are so set as to be alternately repeated and not to overlap each other. Therefore, the period that is given by $T_{SE}+T_{NSE}=T_{SC}$ is one scan period.

That is, in the select period $T_{SE}$ where any one, $X_i$, of the select scan lines $X_1$ to $X_i$, is selected, the select scan driver 5 outputs a pulse signal with the ON voltage $V_{on}$ to the select scan line $X_i$ to turn on the transistors 21 and 22 (the transistors 21 and 22 of every one of the pixel circuits $D_{i,1}$, $D_{i,2}, D_{i,3}, \ldots$, and $D_{i,n}$) that are connected to the select scan line $X_i$. As the transistor 21 is turned on, the current that flows in the signal line $Y_j$ can flow in the pixel circuit $D_{i,j}$. At this time, as the transistors 21 and 22 of the select scan lines $X_1$ to $X_{i-1}$ and the select scan lines $X_{i+1}$ to $X_m$, excluding the select scan line $X_i$, in the select scan lines $X_1$ to $X_m$ are in the non-select period $T_{NSE}$, the OFF voltage $V_{off}$ is output to render both the transistors 21 and 22 off. As the transistors 21 and 22 are turned off, the current that flows in the signal line $Y_j$ cannot flow in the pixel circuit $D_{i,j}$.

In each select period $T_{SE}$ where the select scan lines $X_1$ to $X_m$ are selected, the data driver 3 outputs the gradation signals from all the output terminals $T_1$ to $T_n$, and the levels of the gradation signals output from the respective output terminals $T_1$ to $T_n$ are represented by current values based on the gradation luminances.

The power-supply scan driver 6 is a so-called shift register. That is, based on the clock signal from the external circuit, the power-supply scan driver 6 outputs a scan signal to the power-supply scan lines $Z_1$ to $Z_m$ in order from $Z_1$ to $Z_m$ (the power-supply scan line $Z_1$ comes next to the power-supply scan line $Z_m$) to thereby sequentially scan and select the power-supply scan lines $Z_1$ to $Z_m$.

In detail, as shown in FIG. 8, the power-supply scan driver 6 outputs a low-level select voltage $V_{SELECT}$ (equal to or less than the reference potential $V_{SS}$ but higher than the potential $V_{CC}$ of the low power supply 40) to the power-supply scan lines $Z_1$ to $Z_m$ during each select period $T_{SE}$ and outputs a high-level supply voltage $V_{dd}$ higher than the select voltage $V_{SELECT}$ to the power-supply scan line $Z_i$ during each non-select period $T_{NSE}$ following each select period $T_{SE}$, i.e., during each luminous period TEM. As the supply voltage $V_{dd}$ that is applied during each luminous period $T_{EM}$ is set higher than the reference potential $V_{SS}$ and the potential $V_{CC}$, the drive current can flow into the organic EL elements $E_{i,1}, E_i, 2; E_{i,3}, \ldots$, and $E_{i,n}$ of the i-th row from the power-supply scan line $Z_i$ if the transistor 23 of the i-th row is on and the transistor 21 of the i-th row is off.

Figure 7:
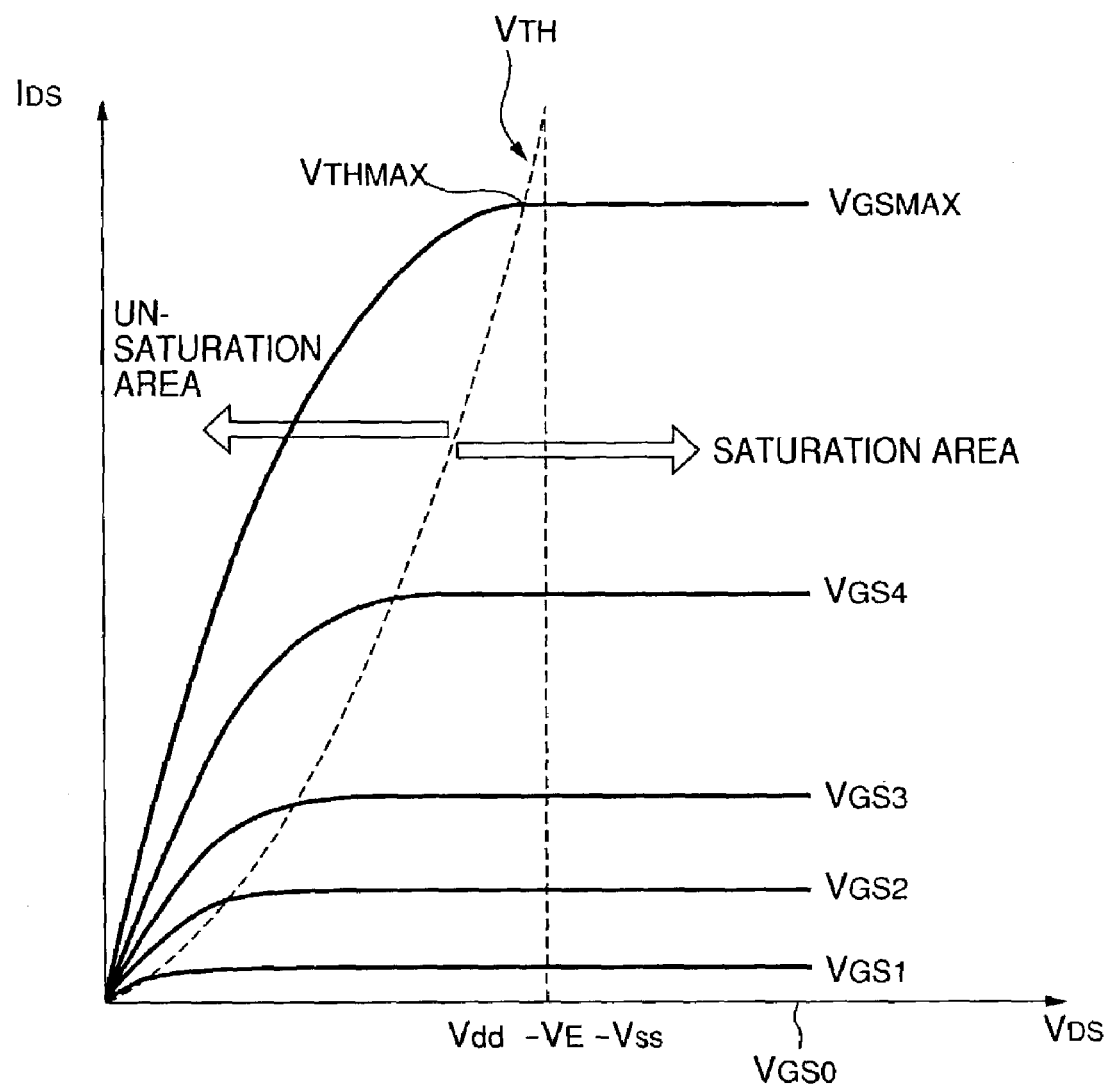
FIG. 7 is a diagram showing the current-voltage characteristic of an N channel field effect transistor.

The supply voltage $V_{dd}$ will be discussed below. FIG. 7 is a graph showing the current-voltage characteristic of the N channel field effect transistor 23. In FIG. 7, the horizontal scale shows the level of the drain-source voltage and the vertical scale shows the value of the drain-source current. In the un-saturation area in the diagram or the area where the level, $V_{DS}$, of the source-drain voltage of the transistor 23 is less than a drain saturation voltage level $V_{TH}$ (the drain saturation voltage level $V_{TH}$ accords to the level, $V_{GS}$, of the gate-source voltage of the transistor 23) given that the gate-source voltage level $V_{GS}$ is constant, a source-drain current value IDS gets larger as the source-drain voltage level $V_{DS}$ becomes larger. Further, in the saturation area in the diagram or the area where the source-drain voltage level $V_{DS}$ is the drain saturation voltage level $V_{TH}$, given that the gate-source voltage level $V_{GS}$ of the transistor 23 is constant, the source-drain current value $I_{DS}$ becomes approximately constant even if the source-drain voltage level $V_{DS}$ becomes larger.

In FIG. 7, gate-source voltage levels $V_{GS0}$ to $V_{GSMAX}$ have a relationship of $V_{GS0}=0<V_{GS1}<V_{GS2}<V_{GS3}<V_{GS4}<V_{GSMAX}$. That is, as apparent from FIG. 7, with the source-drain voltage level $V_{DS}$ being constant, as the gate-source voltage level $V_{GS}$ increases the source-drain current value IDS becomes larger in both the un-saturation area and the saturation area. Further, as the gate-source voltage level $V_{GS}$ increases, the drain saturation voltage level $V_{TH}$ becomes greater.

It is apparent that a slight change in source-drain voltage level $V_{DS}$ results in a change in source-drain current value IDS in the un-saturation area, whereas once the gate-source voltage level $V_{GS}$ is settled, the source-drain current value IDS is determined specifically.

Here, the source-drain current value $I_{DS}$ when the transistor 23 has the gate-source voltage level $V_{GSMAX}$ is set to the value of the current that flows between the pixel electrode 51 and the common electrode 53 of the organic EL element $E_{i,j}$ that emits light with the maximum luminance.

Even if the gate-source voltage level $V_{GS}$ Of the transistor 23 is at the maximum level $V_{GSMAX}$, an equation 2 given below is satisfied so that the transistor 23 keeps the saturation area.

$$V_{dd} - V_E - V_{SS} \geq V_{THMAX} \qquad (2)$$

where $V_E$ is the voltage level which gradually increases due to the high resistance of the organic EL element $E_{i,j}$ during the luminous life period of the organic EL element $E_{i,j}$ and is divided to the voltage of the organic EL element $E_{i,j}$ at the time of the maximum luminance, and $V_{THMAX}$ is the saturation threshold voltage level between the source and drain of the transistor 23 at the time of $V_{GSMAX}$. The supply voltage $V_{dd}$ is determined in such a way as to satisfy the equation 2.

The following will discuss the display operation of the display apparatus 1 with the above-described structure and how to drive the display apparatus 1.

Based on the input clock signal, the select scan driver 5 sequentially outputs a pulse signal of a high level (ON voltage $V_{on}$) to the select scan line $X_m$ of the m-th row from the select scan line $X_1$ of the first row. At the same time, the power-supply scan driver 6 sequentially outputs a pulse signal of a low level (select voltage $V_{SELECT}$) to the power-supply scan line $Z_m$ of the m-th row from the power-supply scan line $Z_1$ of the first row based on the input clock signal. During the select period $T_{SE}$ of each row, the data driver 3 outputs current values corresponding to the gradations of image data to the current mirror circuits $M_1$ to $M_n$ from all the output terminals $T_1$ to $T_n$ based on the clock signal.

As shown in FIG. 8, in each row, the timing at which the ON signal of the high-level voltage $V_{on}$ is output to the select scan line $X_i$ matches with the timing at which the charge signal of the low-level voltage $V_{SELECT}$ is output to the power-supply scan line $Z_i$, the time length of the ON signal of the high-level voltage $V_{on}$ is nearly equal to the time length of the charge signal of the low-level voltage $V_{SELECT}$ and those pulse signals are output during the select period $T_{SE}$ (between time $t_{1S}$ to time $t_{1E}$ in the first row). That is, the period in which the voltage $V_{on}$ output from the select scan driver 5 is synchronous with the period in which the voltage $V_{SELECT}$ output from the power-supply scan driver 6 is shifted. Of the first row to the m-th row, that row in which the ON signal of the high-level $V_{on}$ is output from the select scan driver 5 is a so-called selected row, and charges stored in the capacitor 24 of each of the pixels of that row is newly written while the row is selected.

As apparent from the above, as the select scan driver 5 and the power-supply scan driver 6 shift the pulse signals sequentially from the first row to the m-th row, the pulse signals are sequentially written in the pixels $P_{1,1}$ to $P_{m,n}$ from the first row of pixels $P_{1,1}$ to $P_{1,n}$ to the m-th row of pixels $P_{m,1}$ to $P_{m,n}$ based on the gradation signals from the data driver 3. As such linear sequential scanning is repeated, an image is displayed on the display section 4 of the organic EL display panel 2.

A description will now be given of writing of the gradations of the selected i-th row of pixels $P_{1,1}$ to $P_{i,n}$ in one scan period $T_{SC}$.

In the select period $T_{SE}$ of the i-th row, as the high-level ON signal is output to the select scan line $X_i$ of the i-th row from the select scan driver 5, the transistors 21 and the transistors 22 of all the pixel circuits $D_{i,1}$ to $D_{i,n}$ connected to the select scan line $X_i$ are turned on during the select period $T_{SE}$. Further, in the select period $T_{SE}$ of the i-th row, as the low-level charge signal is output to the power-supply scan line $Z_i$ of the i-th row from the power-supply scan driver 6, the select voltage $V_{SELECT}$ equal to or lower than the reference potential $V_{SS}$ is applied to the power-supply scan line $Z_i$ during the select period $T_{SE}$. As the transistor 22 is on, the voltage is also applied to the gate electrode 23g of the transistor 23, rendering the transistor 23 on.

The current values of the gradation signals that are output in parallel from the output terminals $T_1$ to $T_n$ of the data driver 3 during the select period $T_{SE}$ for each row are determined based on image data input from the external circuit. The transistor 31 that has been turned on by the gradation signal causes the current to flow through the path of output terminal $T_j$→transistor 31→low power supply 40 in each of the current mirror circuits $M_1$ to $M_n$.

The value of the current that flows through the path of output terminal $T_j$→transistor 31→low power supply 40 accords to the level of the gradation signal. That is, the value of the current that flows through the path of output terminal $T_j$→transistor 31→low power supply 40 is the same as the current value of the gradation signal. Then, the capacitor 30 is charged with charges in accordance with the current that flows through the path of output terminal $T_j$→transistor 31→low power supply 40. In accordance with the voltage that is charged according to the gradation signal, the transistor 32 causes the write current to flow between the source and drain. The value of the current that the transistor 32 attempts to flow at this time is determined by the ratio of the channel resistance of the transistor 32 to the channel resistance of the transistor 31. That is, the value of the current that the transistor 32 attempts to flow is determined by the current reduction ratio. The individual current mirror circuits $M_1$ to $M_n$ have the same current reduction ratio.

In the select period $T_{SE}$ of the i-th row, as described above, the transistors 21, 22 and 23 of every one of the i-th row of pixel circuits $D_{i,1}$ to $D_{i,n}$ are on and the voltage level of the power-supply scan line $Z_i$ is the select voltage $V_{SELECT}$, the write current that flows in every one of the i-th row of pixel circuits $D_{i,1}$ to $D_{i,n}$ flows through the path of power-supply scan line $Z_i \rightarrow$ transistor 23 $\rightarrow$ transistor 21 $\rightarrow$ signal lines $Y_1$ to $Y_n \rightarrow$ each transistor 32 of the current mirror circuits $M_1$ to $M_n \rightarrow$ low power supply 40. At this time, the value of the write current that likewise flows through the path of power-supply scan line $Z_i \rightarrow$ transistor 23 $\rightarrow$ transistor 21 $\rightarrow$ signal lines $Y_1$ to $Y_n \rightarrow$ each transistor 32 of the current mirror circuits $M_1$ to $M_n \rightarrow$ low power supply 40 in any one of the first column to the n-th column due to the function of the current mirror circuit $M_j$ is the value of the current that flows through the path of output terminal $T_j \rightarrow$ transistor 31 $\rightarrow$ low power supply 40 multiplied by the current reduction ratio of the current mirror circuit $M_j$. Provided that the channel lengths of the transistors 31 and 32 are set equal to each other and the ratio of the channel width of the transistor 31 to the channel width of the transistor 32 is set to 20:1 in each other the In each of the current mirror circuits $M_1$ to $M_n$, for example, the current reduction ratio becomes 1/20 and the value of the current that flows between the source and drain of the transistor 32 or the value of the current that flows between the source and drain of the transistor 31 with respect to the current value of the gradation signal output from the output terminal $T_j$ becomes 1/20.

As apparent from the above, because of the current mirror circuit $M_j$ connected to the signal line $Y_j$, the value of the write current of the signal line $Y_j$ depends on the value of the drain-source current of the transistor 31 and can be made smaller than the value of the drain-source current of the transistor 31. To ensure the organic EL element $E_{i,j}$ with the luminous gradation according to image data, it is necessary to supply the organic EL element $E_{i,j}$ with a current which has a very small value with a small gradation-originated variation. According to the invention, should the data driver 3 not be able to supply such a gradation current directly to the organic EL element $E_{i,j}$, the value of the currents output from the output terminals $T_1$ to $T_n$ of the data driver 3 can be modulated to minute values with slight gradation variations by intervening the current conversion section 7 whose current reduction ratio has been set to a given value beforehand by the design of the transistors 31 and 32, between the data driver 3 and the individual signal lines $Y_1$ to $Y_n$. Even if the value of the drain-source current of the transistor 31 is slightly deviated from the current value that should originally be output due to the occurrence of a leak current in the interconnection between the data driver 3 and the transistor 31, therefore, the deviation of the write current value of the signal line $Y_j$ is suppressed low in proportional to the current reduction ratio, which can in turn suppress the deviation of the luminous gradation of the organic EL element $E_{i,j}$ as will be discussed later.

In the select period $T_{SE}$ of the i-th row, as described above, in every one of the i-th row of pixel circuits $D_{i,1}$ to $D_i$, the write current flows through the path of power-supply scan line $Z_i \rightarrow$ transistor 23 $\rightarrow$ transistor 21 $\rightarrow$ signal lines $Y_1$ to $Y_n \rightarrow$ each transistor 32 of the current mirror circuits $M_1$ to $M_n \rightarrow$ low power supply 40. The value of the write current that flows in each of those pixel circuits $D_{i,1}$ to $D_{i,n}$ is the current value output from the respective one of the output terminals $T_1$ to $T_n$ multiplied by the current reduction ratio of the associated one of the current mirror circuits $M_1$ to $M_n$ and is the value of the current that flows in the associated one of the organic EL elements $E_{i,1}$ to $E_{i,n}$ in the luminous period $T_{EM}$ to be discussed later.

At this time, the other end of the capacitor 24 of each of the i-th row of pixel circuits $D_{i,1}$ to $D_{i,n}$ (the source electrode 23s of the transistor 23) has a potential which corresponds to the current value of the gradation signal output from the data driver 3 and is equal to or lower than the gate potential of the transistor 23. That is, in each of the i-th row of pixel circuits $D_{i,1}$ to $D_{i,n}$, the capacitor 24 is charged with charges whose quantity accords to the voltage level between the gate electrode 23g and source electrode 23s of the transistor and accords to the value of the current that flows in the transistor 23. That is, the write current according to the current value of the gradation signal flows between the source and drain of the transistor 23 and the signal lines $Y_1$ to $Y_n$, resulting in that the voltage needed to allow the write current of a given current value to flow is applied between the gate electrode 23g and source electrode 23s of the transistor 23 and the capacitor 24 is charged with charges whose quantity accords to the voltage between the gate electrode 23g and source electrode 23s of the transistor 23, so that the quantity of charges charged in the capacitor 24 accords to the value that is obtained by multiplying the current value of the gradation signal by the current reduction ratio. In other words, in the select period $T_{SE}$, in each of the i-th row of pixel circuits $D_{i,1}$ to $D_{i,n}$, as the transistors 21 and 22 forcibly let the write current whose value is the current value of the gradation signal multiplied by the current reduction ratio flow in the transistor 23 too, the write current forcibly flows in the transistor 23 and the write current is forcibly converted to the gate-source voltage between the gate and source where the current flows, and the capacitor 24 serves to hold the gate-source voltage over a predetermined period.

As apparent from the above, at time $t_{iS}$ where the select period $T_{SE}$ starts, charges charged in the capacitor 24 of each of the i-th row of pixel circuits $D_{i,1}$ to $D_{i,n}$ have been refreshed since the previous one scan period $T_{SC}$ and newly written and the current value of the capacitor 24 of each of the i-th row of pixel circuits $D_{i,1}$ to $D_{i,n}$ has also been refreshed since the previous one scan period $T_{SC}$ and newly written.

In any one of the i-th row of pixel circuits $D_{i,1}$ to $D_{i,n}$, the potential at any point in the path of transistor 23 $\rightarrow$ transistor 21 $\rightarrow$ signal line $Y_j$ varies due to the internal resistances or the like of the transistors 21, 22 and 23 which change with time. According to the embodiment, however, the value of the write current that flows through the path of transistor 23 $\rightarrow$ transistor 21 $\rightarrow$ signal line $Y_j$ is forcibly set so as to be the current value of the gradation signal output from the output terminal $T_j$ multiplied by the current reduction ratio, regardless of changes in the internal resistances of the transistors 21, 22 and 23. Even if the internal resistances of the transistors 21, 22 and 23 change with time, therefore, the value of the write current that flows through the path of transistor 23 $\rightarrow$ transistor 21 $\rightarrow$ signal line $Y_j$ does not depend on changes in the internal resistances of the transistors 21, 22 and 23.

In the select period $T_{SE}$ of the i-th row, because the reference potential $V_{SS}$ is applied to the common electrode 53 of each of the i-th row of organic EL elements $E_{i,1}$ to $E_{i,n}$ and the power-supply scan line $Z_i$ is at the select voltage $V_{SELECT}$ which is equal to or the reference potential $V_{SS}$, 0 (V) or the reverse bias voltage is applied to the i-th row of organic EL elements $E_{i,1}$ to $E_{i,n}$ so that the current does not flow in the i-th row of organic EL elements $E_{i,1}$ to $E_{i,n}$.

Therefore, the current that flows through the transistor 23 becomes the write current itself which flows in the signal lines $Y_1$ to $Y_n$.

At time $t_{iE}$ where the select period $T_{SE}$ of the i-th row ends (start time $t_{iE}$ of the non-select period $T_{NSE}$), the high-level ON signal output on the select scan line $X_i$ from the select scan driver 5 ends and the low-level charge signal output on the power-supply scan line $Z_i$ from the power-supply scan driver 6 ends. That is, in the non-select period $T_{NSE}$ from the end time $t_{iE}$ to the start time $t_{iS}$ of the next select period $T_{SE}$, the select scan driver 5 applies the OFF signal with the level of the OFF voltage $V_{off}$ to the gate electrode 21g of the transistor 21 and the gate electrode 22g of the transistor 22 in each of the i-th row of pixel circuits $D_{i,1}$ to $D_{i,n}$ and the power-supply scan driver 6 applies the forward bias signal with the level of the supply voltage $V_{dd}$ to the power-supply scan line $Z_i$.

In the non-select period $T_{NSE}$ of the i-th row, therefore, the transistors 21 of the i-th row of pixel circuits $D_{i,1}$ to $D_{i,n}$ are turned off to cut off the write current that flows into the signal lines $Y_1$ to $Y_n$ from the power-supply scan line $Z_i$ (it is to be noted that in the non-select period $T_{NSE}$ of the i-th row, the write current flows into the signal lines $Y_1$ to $Y_n$ from any one of the power-supply scan line $Z_1$ to $Z_m$ excluding the power-supply scan line $Z_i$). Further, in the non-select period $T_{NSE}$ of the i-th row, in any one of the i-th row of pixel circuits $D_{i,1}$ to $D_{i,n}$, even if the transistors 21 and 22 are turned off, the charges that have been charged in the capacitor 24 in the immediately previous select period $T_{SE}$ are confined by the transistors 21 and 22 and the transistor 23 keeps the drive state according to the charges charged in the capacitor 24. That is, in any one of the i-th row of pixel circuits $D_{i,1}$ to $D_{i,n}$, the gate-source voltage $V_{GS}$ of the transistor 23 is substantially identical in both the non-select period $T_{NSE}$ and the immediately previous select period $T_{SE}$.

Even in the non-select period $T_{NSE}$ of the i-th row, therefore, the transistors 23 in the i-th row of pixel circuits $D_{i,1}$ to $D_{i,n}$ keep letting the drive current having the same value as the write current in the immediately previous select period $T_{SE}$ flow. Because the common electrodes 53 of the i-th row of organic EL elements $E_{i,1}$ to $E_{i,n}$ have the reference potential $V_{SS}$ and the power-supply scan line $Z_i$ has the supply voltage $V_{dd}$ higher than the in the non-select period $T_{NSE}$ reference potential $V_{SS}$, the forward bias voltage is applied to the i-th row of organic EL elements $E_{i,1}$ to $E_{i,n}$. The drive current flows in each of the i-th row of organic EL elements $E_{i,1}$ to $E_{i,n}$ because of the function of the transistor 23, the organic EL elements $E_{i,1}$ to $E_{i,n}$ emit lights. In the pixels $P_{i,1}$ to $P_{i,n}$ of the i-th row, the gradation signals output from the output terminals $T_1$ to $T_n$ of the data driver 3 and the drive current equal to the write current that flows in the signal lines $Y_1$ to $Y_n$ in the select period $T_{SE}$ by the current conversion section 7 with a given current reduction ratio flow in the organic EL elements $E_{i,1}$ to $E_{i,n}$ in the non-select period $T_{NSE}$, thus allowing the luminous brightness of the gradations according to image data to be controlled and maintained.

That is, in the non-select period $T_{NSE}$ of the i-th row, in any of the i-th row of pixel circuits $D_{i,1}$ to $D_{i,n}$, the transistor 21 serves to electrically cut off between the signal line $Y_j$ and the transistor 23 so as not to let the write current flowing in the signal line $Y_j$ flow in the transistor 23, the transistor 22 serves to trap the charges in the capacitor 24 to thereby keep the gate-source voltage of the transistor 23 converted in the select period $T_{SE}$, and the transistor 23 serves to let the drive current with the value according to the held gate-source voltage flow in the organic EL element $E_{i,j}$.

The values of the drive currents flowing in the organic EL elements $E_{i,1}$ to $E_{i,n}$ are the same as the drive currents flowing in the associated transistors 23 of the pixel circuits $D_{i,1}$ to $D_{i,n}$ and thus are the same as the values of the write currents flowing in the associated transistors 23 of the pixel circuits $D_{i,1}$ to $D_{i,n}$. In the luminous period TEM of the i-th row (i.e., the non-select period $T_{NSE}$), the drive currents with such values flow in the i-th row of organic EL elements $E_{i,1}$ to $E_{i,n}$ which in turn emit lights with the luminous gradations according to the respective drive current values. In the select period $T_{SE}$ of the i-th row, as mentioned above, the current values of the transistors 23 of the i-th row of pixel circuits $D_{i,1}$ to $D_{i,n}$ become the desired values so that the organic EL elements $E_{i,1}$ to $E_{i,n}$ are supplied with the desired drive currents and thus keep emitting lights with the desired luminous gradations until the next select period $T_{SE}$.

The provision of the current mirror circuits $M_1$ to $M_n$ on the data driver side of the respective signal lines $Y_1$ to $Y_n$ in the embodiment makes it unnecessary to provide a current mirror circuit for each pixel. This can minimize the number of transistors to be provided pixel by pixel, making it possible to suppress the reduction in the numerical aperture of the pixels and supply minute currents according to the luminous gradations of the organic EL elements $E_{1,1}$ to $E_{m,n}$.

The current mirror circuits $M_1$ to $M_n$ allow the write currents whose values are proportional to the current values of the gradation signals flow in the signal lines $Y_1$ to $Y_n$. Even if the data driver 3 cannot itself let minute write currents flow, therefore, minute write currents with the adequate values for the luminous brightnesses of the organic EL elements $E_{1,1}$ to $E_{m,n}$ can flow in the signal lines $Y_j$.

Further, the provision of the current mirror circuits $M_1$ to $M_n$ make the values of the write currents of the signal lines $Y_1$ to $Y_n$ proportional to the current values of the gradation signals from the output terminals $T_1$ to $T_n$ (i.e., the values of the drain-source currents of the transistors 31) and smaller than the values of the drain-source currents of the transistors 31. Even if the occurrence of a leak current in the data driver 3 or the like reduces the value of the current flowing from any of the output terminals $T_1$ to $T_n$ (i.e., the drain-source current value of the transistor 31), therefore, the reduction in the current value of the associated one of the signal lines $Y_1$ to $Y_n$ become smaller so that the drain-source current value does not become significantly small. In other words, even if the leak current reduces the output of the data driver 3, it does not significantly affect the current values of the signal lines $Y_1$ to $Y_n$ and the luminous brightnesses of the organic EL elements $E_{1,1}$ to $E_{m,n}$ do not get considerably lower.

Second Embodiment

Figure 9:
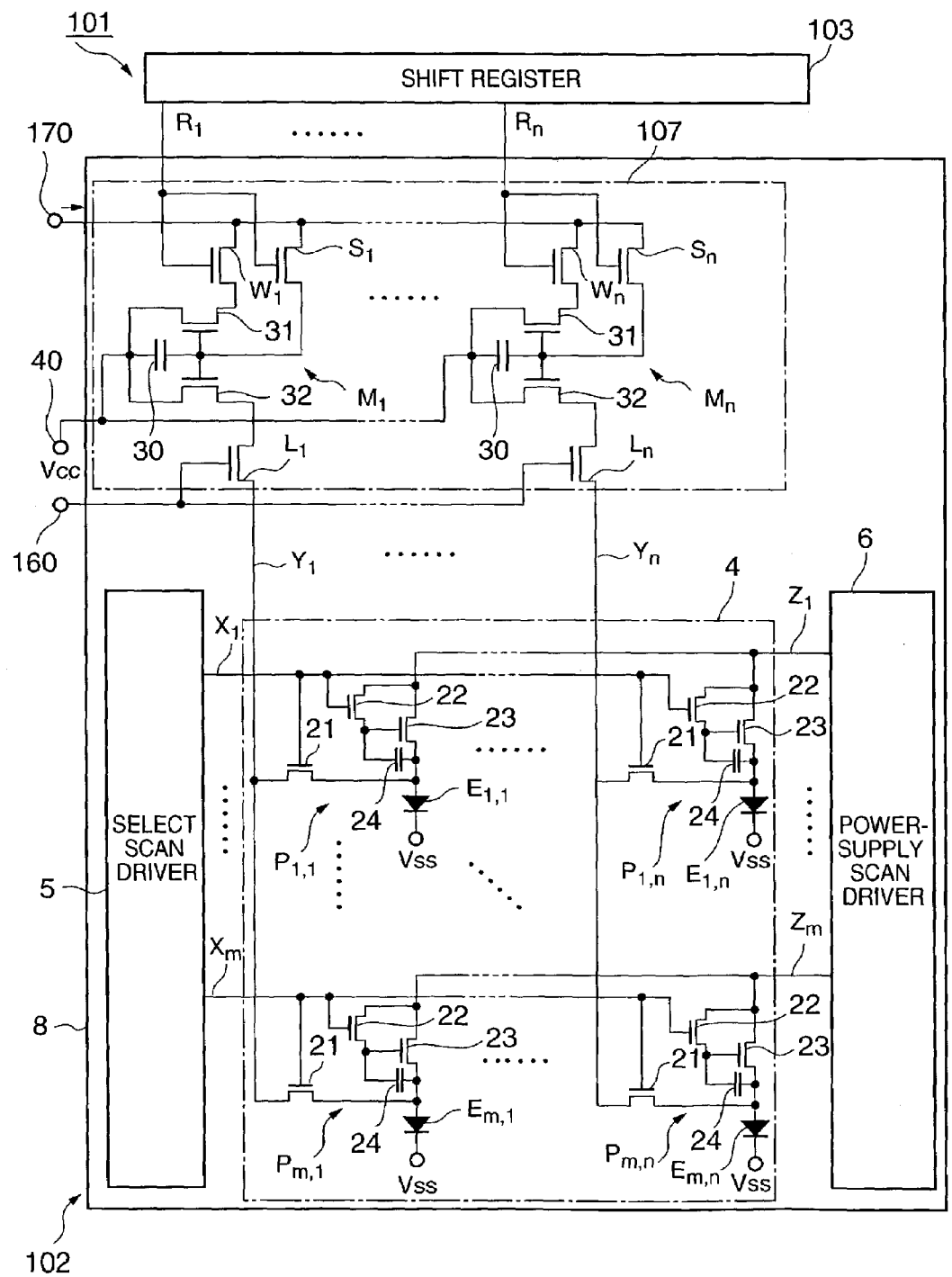
FIG. 9 is a block diagram illustrating a specific mode of another display apparatus.

FIG. 9 is a block diagram illustrating a display apparatus 101 of a different mode from the display apparatus 1 according to the first embodiment. As shown in FIG. 9, the display apparatus 101 has an organic EL display panel 102 which provides color display by the active matrix driving system and a shift register 103.

The organic EL display panel 102 has a basic structure that includes a transparent substrate 8, a display section 4 or the display area on which an image is substantially displayed, a select scan driver 5 provided around the display section 4 or in the non-display area, a power-supply scan driver 6 and a current conversion section 107. Those circuits 4 to 6 and 107 are formed on the transparent substrate 8. The display section 4, the select scan driver 5, the power-supply scan driver 6 and the transparent substrate 8 are the same as those of the display apparatus 1 of the first embodiment. In case of the P$^+$ substrate 101 of the second embodiment, therefore, the timing for voltage application by the select scan driver 5, the timing for voltage application by the power-supply scan driver 6, the refreshing of the pixels P$_{1,1}$ to P$_{m,n}$ and the gradation expression of the pixels P$_{1,1}$ to P$_{m,n}$ are the same as those of the display apparatus 1 of the first embodiment.

It is to be noted however that the second embodiment differs from the first embodiment in how to apply the write current; specifically, while the data driver 3 and the current conversion section 7 allow the write current to flow in the signal lines Y$_\alpha$ to Y$_n$ in the display apparatus 1 of the first embodiment, the shift register 103 and the current conversion section 107 allow the write current to flow in the signal lines Y$_1$ to Y$_n$.

In the current conversion section 107, the current mirror circuits M$_1$ to M$_n$ are provided column by column as in the current conversion section 7 of the first embodiment, in addition to which first transistors L$_1$ to L$_n$, second transistors S$_1$ to S$_n$ and third transistors W$_1$ to W$_n$ are provided column by column.

The first transistors L$_1$ to L$_n$, second transistors S$_1$ to S$_n$ and third transistors W$_1$ to W$_n$ are MOS field effect thin film transistors and particularly are a-Si transistors each having an amorphous semiconductor layer, but may be p-Si transistors each having a polysilicon semiconductor layer or integrated circuits of monocrystalline silicon. Further, the first transistors L$_1$ to L$_n$, second transistors S$_1$ to S$_n$ and third transistors W$_1$ to W$_n$ may have an inverse staggered type structure or a coplanar structure. The first transistors L$_1$ to L$_n$, second transistors S$_1$ to S$_n$ and third transistors W$_1$ to W$_n$ will be described as N channel field effect transistors in the following description.

With regard to each column, the current mirror circuit M$_j$ comprises transistors 31 and 32 and a capacitor 30 as per the first embodiment. The connections and structures of those components 30 to 32 are basically the same as those of the first embodiment, but differ in that the drain electrode of the transistor 31 is connected to the source electrode of the transistor W$_j$, the gate electrodes of the transistors 31 and 32 are connected to the source electrode of the second transistor S$_j$ and the drain electrode of the transistor is connected to the source electrode of the first transistor L$_j$.

The drain electrode of the first transistor L$_j$ is connected to the signal line Y$_j$. The gate electrodes of the first transistors L$_1$ to L$_n$ are commonly connected to a sync-signal input terminal 160.

The gate electrode of the second transistor S$_j$ and the gate electrode of the third transistor W$_j$ are connected together to an output terminal R$_j$ of the shift register 103. The drain electrodes of the second transistors S$_1$ to S$_n$ and the drain electrodes of the third transistors W$_1$ to W$_n$ are connected together to a common gradation-signal input terminal 170.

Based on a clock signal from an external circuit, the shift register 103 shifts and outputs the ON-level pulse signal from the output terminal R$_1$ to the output terminal R$_n$ in order (the output terminal R$_1$ comes next to the output terminal R$_n$) to thereby sequentially select the current mirror circuits M$_1$ to M$_n$. One shift period of the shift register 103 is shorter than one shift period of the select scan driver 5 and the power-supply scan driver 6 in such a way that while the select scan driver 5 and the power-supply scan driver 6 shift the pulse signal to the (i+1)-th row from the i-th row, the shift register 103 sequentially shifts the pulse signals of the first column to the n-th column of the (i+1)-th row to the output terminal R$_n$ from the output terminal R$_1$ and outputs n ON-level pulse signals.

The gradation signals of the first row to the n-th row are sequentially input to the gradation-signal input terminal 170 in each select period T$_{SE}$ by the external circuit. When the gradation signal of the i-th row is input from the gradation-signal input terminal 170, the current mirror circuits M$_1$ to M$_n$ causes the write current which is the current value of that gradation signal multiplied by the current reduction ratio to flow between the source and drain of each transistor 23 of the i-th row and in the signal lines Y$_1$ to Y$_n$. As the capacitor 24 holds charges matching with that write current, the drive current whose value is equal to the value of the write current flows between the source and drain of each transistor 23 and in the organic EL elements E$_{i,1}$ to E$_{i,n}$ in the non-select period T$_{NSE}$ (luminous period T$_{EM}$) of the first row, so that the organic EL elements E$_{i,1}$ to E$_{i,n}$ emit light with a given luminous brightness. The gradation signal which is input from the gradation-signal input terminal 170 may be either an analog signal or a digital signal, and is input to the drain electrodes of the second transistors S$_1$ to S$_n$ and the drain electrodes of the third transistors W$_1$ to W$_n$ at the timings at which the ON-level pulse signals from the output terminals R$_1$ to R$_n$ of the shift register 103 are input. The period of the gradation signal for one row is shorter than the one shift period of the select scan driver 5 and the power-supply scan driver 6 in such a way that while the select scan driver 5 and the power-supply scan driver 6 shift the pulse signal to the (i+1)-th row from the i-th row, the gradation signals of the organic EL elements E$_{i+1,1}$ to E$_{i+1,n}$ are respectively input to the current mirror circuits M$_1$ to M$_n$.

After the shift register 103 inputs the gradation signal from the gradation-signal input terminal 170 to the current mirror circuits M$_1$ to M$_n$, the sync signal is input to the sync-signal input terminal 160 from the external circuit. The period of the sync signal is the same as one shift period of the select scan driver 5 and the power-supply scan driver 6 and the period in which the ON-level sync signal is input is the period in which the select scan driver 5 and power-supply scan driver 6 output the ON-level pulse signal. Every time the select scan driver 5 and the power-supply scan driver 6 shift the pulse signal, therefore, the sync signal with the ON-level voltage is input to the sync-signal input terminal 160.

The operation of the display apparatus 101 with the above-described structure will be explained below.

As shown in FIG. 8, the select scan driver 5 and power-supply scan driver 6 shift the pulse signal to the first row to the m-th row line by line, as per the first embodiment.

Figure 10:
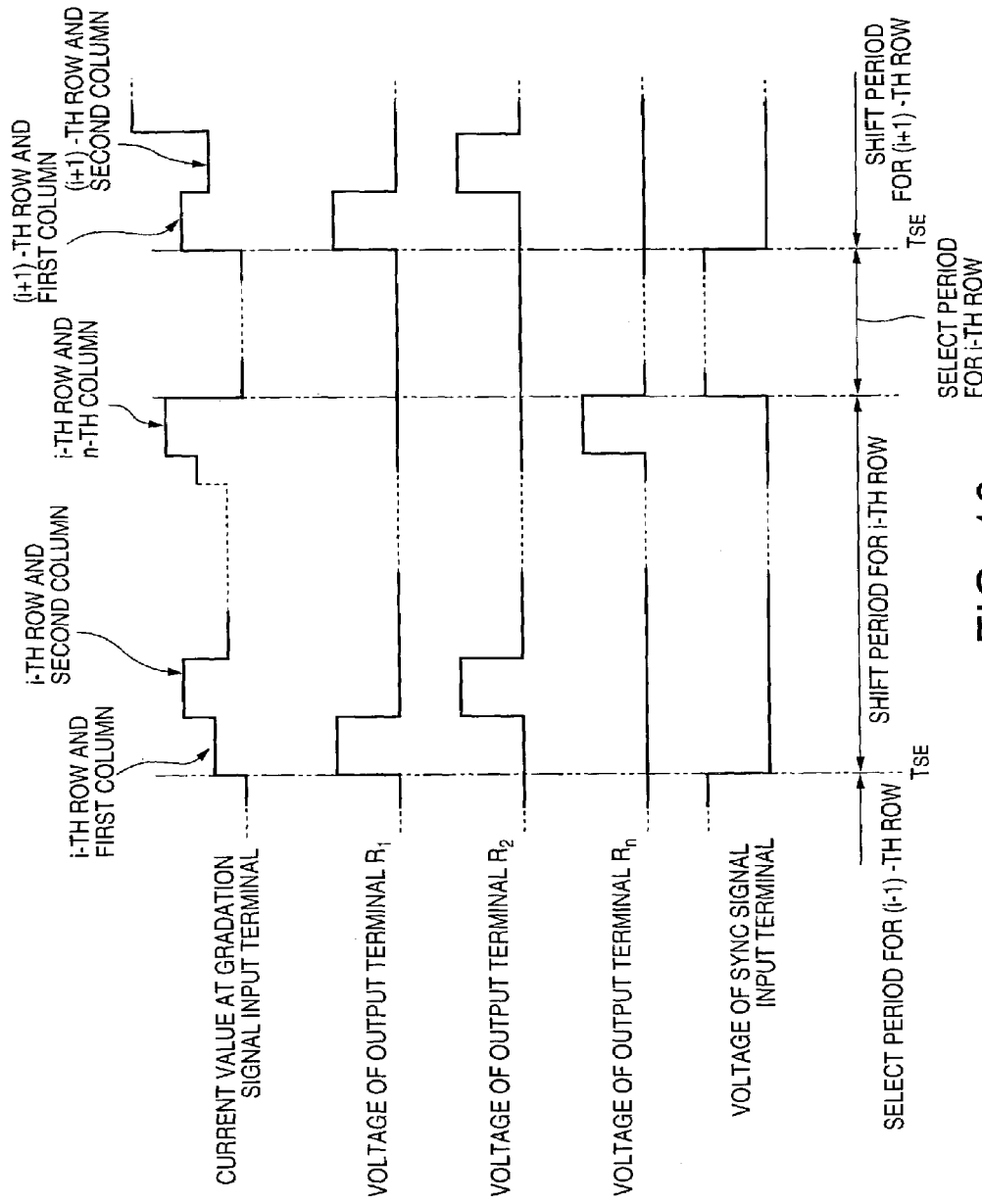
FIG. 10 is a timing chart illustrating signals in the display apparatus in FIG. 9.
Figure 11:
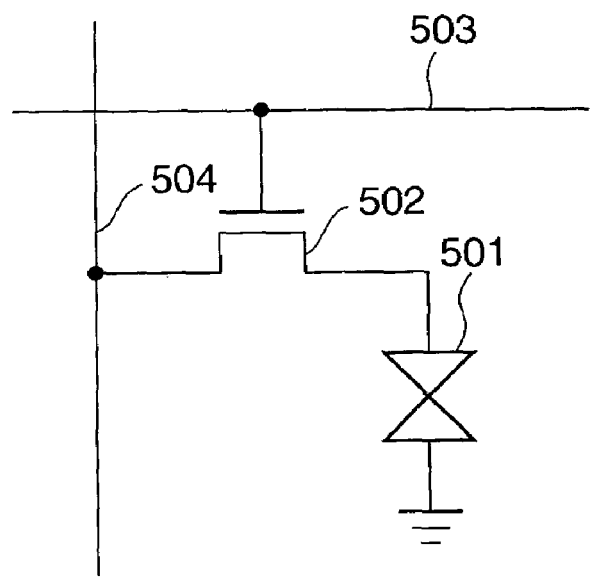
FIG. 11 is a diagram showing an equivalent circuit of a pixel of a liquid crystal display.
Figure 12:
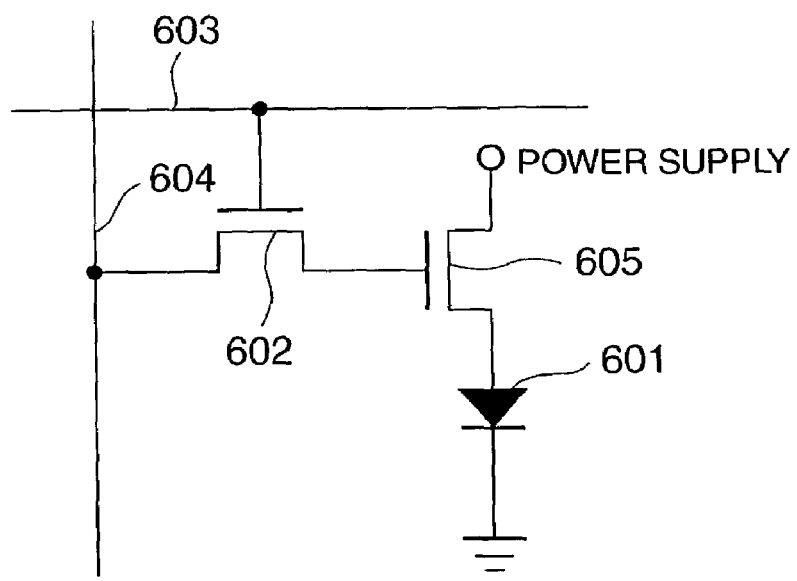
FIG. 12 is a diagram showing an equivalent circuit of a pixel of a voltage-writing display apparatus.
Figure 13:
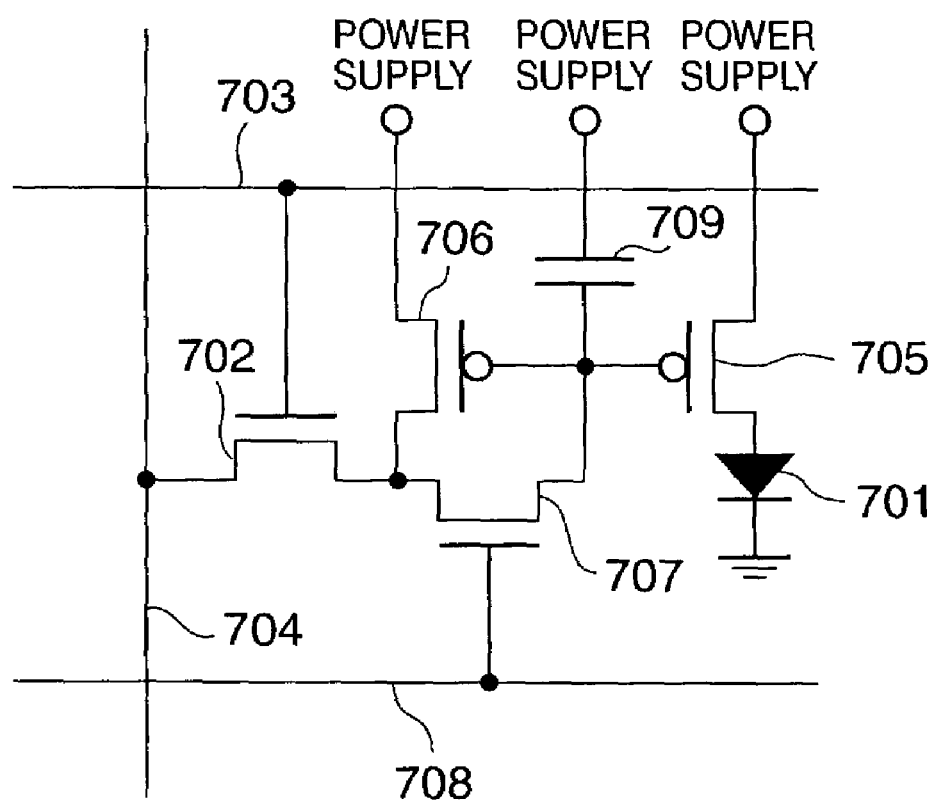
FIG. 13 is a diagram showing an equivalent circuit of a pixel of a conventional current-writing display apparatus.

As shown in FIG. 10, the shift register 103 shifts the ON-level pulse signal of the second transistors S$_1$ to S$_n$ and the third transistors W$_1$ to W$_n$ from the output terminal R$_1$ to the output terminal R$_n$ between the select period T$_{SE}$ of the (i−1)-th row and the select period T$_{SE}$ of the i-th row. While the shift register 103 is shifting the pulse signal, the voltage of the sync-signal input terminal 160 is at an OFF level (low level).

When the shift register 103 outputs the ON-level pulse signal to the output terminal R$_j$, the gradation signal for the organic EL element E$_{i,j}$ is input to the gradation-signal input terminal 170. Because the j-th row of second transistors S$_j$ and third transistors W$_j$ are on at this time, the gradation signal for the organic EL element E$_{i,j}$ is input to the current mirror circuit M$_j$, rendering the transistor 31 and transistor 32 on, and the capacitor 30 is charged with charges whose quantity accords to the current value of the gradation signal.

That is, the second transistor $S_j$ and the third transistor $W_j$ serve to fetch the gradation signal into the current mirror circuit $M_j$ at the time of selecting the j-th row.

As the transistor 31 of the j-th column is turned on, the current flows through the path of gradation-signal input terminal 170→third transistor $W_j$→transistor 31→low power supply 40 in the current mirror circuit $M_j$, and the capacitor 30 is charged with the charges.

As the voltage of the sync-signal input terminal 160 has an OFF level at this time, the first transistor $L_j$ is off so that the write current does not flow in the current mirror circuit $M_j$ and the signal line $Y_j$.

When the pulse signal is output to the output terminal $R_{j+1}$ by the shift register 103, the gradation signal for the organic EL element $E_{i,j+1}$ is input to the gradation-signal input terminal 170 and the capacitor 30 of the (j+1)-th column is charged with charges whose quantity accords to the current value of the gradation signal as in the case of the j-th column. Because the transistors $S_j$ and $W_j$ of the j-th row are off at this time, the charges charged in the capacitor 30 of the j-th column are confined by the transistor $S_j$, so that the capacitor 30 of the j-th column allows the transistor 31 and transistor 32 of the j-th column to keep the ON state without being affected by the gradation signal of the (j+1)-th column. That is, even when the j-th column is not selected, the transistor $S_j$ serves to keep the gate voltage according to the current value of the gradation signal of the time at which the j-th column is selected.

As the shift register 103 shifts the pulse signal in the above-described manner, the capacitors 30 of the first column to the n-th column are charged with the charges whose quantity accords to the current value of the gradation signal column by column in the named order.

When charging of the capacitor 30 of the n-th row is completed, the shift register 103 temporarily stops shifting the pulse signal and when the directly subsequent i-th select period $T_{SE}$ comes, the ON-level (high-level) sync signal from the sync-signal input terminal 160 is input to all columns of first transistors $L_1$ to $L_n$ which are in turn rendered on simultaneously. At this time, each capacitor 30 is charged with the charges according to the gradation signal of each column the transistors 31 and 32 of each column allow the write current to flow there according to the charges of the capacitor 30. While the write currents flowing in the i-th row of pixel circuits $D_{i,1}$ to $D_{i,n}$ flow through the path of power-supply scan line $Z_i$→individual transistors 23 of pixel circuits $D_{i,1}$ to $D_{i,n}$→individual transistors 21 of pixel circuits $D_{i,1}$ to $D_{i,n}$→signal lines $Y_1$ to $Y_n$→individual first transistors $L_1$ to $L_n$→individual transistors 32 of current mirror circuits $M_1$ to $M_n$→low power supply 40, the values of the write currents flowing toward the low power supply 40 from the power-supply scan line $Z_i$ become the current values of the associated gradation signal currents flowing through the path of gradation-signal input terminal 170→individual third transistors $W_1$ to $W_n$→individual transistors 31 of current mirror circuits $M_1$ to $M_n$→low power supply 40 multiplied by the current reduction ratios of the current mirror circuits $M_1$ to $M_n$.

In the subsequent non-select period $T_{NSE}$ of the i-th row, the drive currents whose values are the values of the gradation signal currents multiplied by the current reduction ratios flow in the transistors 23 of the pixel circuits $D_{i,1}$ to $D_{i,n}$ and the organic EL elements $E_{i,1}$ to $E_{i,n}$ as per the first embodiment, so that the display section 4 emit light with the gradation brightnesses that match with the drive currents of the i-th row of organic EL elements $E_{i,1}$ to $E_{i,n}$.

As the first half of the non-select period $T_{NSE}$ of the i-th row becomes the shift period of the (i+1)-th row, the sync-signal input terminal 160 becomes off level (low level) then, the shift register 103 sequentially outputs the (i+1)-th row of pulse signals to the output terminals $R_1$ to $R_n$ and the gradation signals for presenting display with the gradation brightnesses of the (i+1)-th row of organic EL elements $E_{i+1,1}$ to $E_{i+1,n}$ are written in the current mirror circuits $M_1$ to $M_n$, respectively.

Because the current mirror circuits $M_1$ to $M_n$ are also provided outside the display section 4 in the second embodiment, it is unnecessary to provide a current mirror circuit in a pixel, thereby making it possible to suppress a reduction in the ratio of the luminous area of the pixel to the non-luminous area. Because the current mirror circuit is not provided pixel by pixel, it is possible to suppress the reduction in production yield and reduce the probability of an in-plane variation in the characteristics of the current mirror circuits. Because of the provision of the current mirror circuit $M_j$, even if the write current value slightly deviates from the current value that should originally be output to the gradation-signal input terminal 170 or the like, the deviation of the write current value of the signal line $Y_j$ is suppressed small according to the deviation of the luminous gradation of the organic EL element $E_{i,j}$ can thus be suppressed.

The present invention is not limited to the above-described embodiments, but may be modified in various forms and subjected to various design changes within the scope of the invention.

In the display apparatus 1 or 101, the gradation brightness of the pixel $P_{i,j}$ is designated by the value of the so-called sink current which is the current drawn out into the signal line $Y_j$ from the pixel $P_{i,j}$. However, the gradation brightness of the pixel $P_{i,j}$ may be designated by the value of the current flowing to the pixel $P_{i,j}$ from the signal line $Y_j$. In this case, a current mirror circuit is also provided for each signal line to allow the current which is proportional to, and is smaller than, the current value of the gradation signal from the data driver to flow into the signal line.

While the active drive circuit for the pixel $P_{i,j}$ may be adequately changed, such as using, for example, an MIM element in place of a TFT, it is desirable provide, around the organic EL element, a pixel circuit set in such a way as to hold charges which match with the write current by enforcing the write current flowing in the signal line when the scan line is selected to flow in the pixel circuit and then let the drive current with a value equal to the value of the write current flow in the pixel circuit and organic EL element with the help of the held charges.

Although the pixel circuit $D_{i,j}$ does not let the write current flow in the organic EL element $E_{i,j}$ in the select period $T_{SE}$ in each embodiment discussed above, the pixel circuit may be so designed as to allow the write current to flow in the organic EL element $E_{i,j}$ even in the select period $T_{SE}$ in which case the value of the drive current allowed to flow in the organic EL element $E_{i,j}$ in the non-select period $T_{NSE}$ by the pixel circuit is the same as the value of the write current flowing in the pixel circuit in the immediately previous select period $T_{SE}$. The pixel circuit may not comprise three transistors but may comprise four or more transistors as long as it has a capability to allow the drive current with a value equal to the value of the write current in the select period $T_{SE}$ to flow in the organic. EL element $E_{i,j}$ in the non-select period $T_{NSE}$. It is however desirable that the pixel circuit should comprise fewer transistors.

Although the light irradiated from the organic EL element $E_{i,j}$ is output from the underlying pixel electrode 51 in the embodiments discussed above, the invention is not limited to this particular design but the common electrode 53 above the organic EL layer 52 may be made light transmittive so that light is output from above the organic EL layer 52. It is preferable then that the pixel electrode 51 below the organic EL layer 52 should be light reflective but may be light transmittive if a non-transmittive or reflective layer is provided below the pixel electrode 51.

Although the pixel electrode 51 serves as the anode electrode and the common electrode 53 serves as the cathode in the above-described embodiments, the pixel electrode 51 and the common electrode 53 may be made to serve as the cathode electrode and the anode, respectively.

While the current mirror circuits $M_1$ to $M_n$ of each column are provided with the second transistors $S_1$ to $S_n$ and third transistors $W_1$ to $W_n$ respectively in the second embodiment, the second transistor and the third transistor may be replaced with a single transistor. That is, the j-th column may be provided with a single transistor whose gate is connected to the output terminal $R_j$ of the shift register 103, whose drain is connected to the gradation-signal input terminal 170 and whose source is connected to one electrode of the capacitor 30, the drain and gate of the transistor 31 and the gate of the transistor 32, thereby reducing the number of required transistors.

Although an organic EL element is used as a luminous element in the above-described embodiments, a luminous element in use may be of the type that does not allow the current to flow when the reverse bias voltage is applied but allow the current to flow when the forward bias voltage is applied and emit light with the brightness according to the size of the flowing current. For example, an LED (Light Emitting Diode) or the like may serve as a luminous element instead of an organic EL element.

As the current control driver is not provided pixel by pixel but connected to the signal line, it is possible to minimize the number of elements provided on a pixel. This increases the ratio of the luminous area of the pixel to the non-luminous area and can thus provide a high-definition display with a high numerical aperture.

As the write current whose value is proportional to the current value of the gradation signal is allows to flow in the signal line by the current control driver, the write current having the adequate value can be let flow in the signal line even the range of the current value of the gradation signal from the gradation signal output means is beyond the range of the value of the drive current flowing in the luminous element.

The write current whose value is proportional to and smaller than the current value of the gradation signal flows in the signal line, so that even when noise occurs in the gradation signal due to the leak current, the current control driver can suppress the noise and is not affected considerably.

What is claimed is:

1. A display apparatus comprising:
    a plurality of pixels which are respectively arranged at intersections of a plurality of scan lines and a plurality of signal lines in a display area, and each of which comprises: (i) an optical element which performs an optical operation based on a current value of a drive current flowing therethrough, and (ii) a pixel circuit which supplies said drive current to said optical element; and
    a current control driver which is arranged in an area other than said display area, which is connected to each of said signal lines, and which reduces a current value of a gradation signal by a predetermined current reduction ratio so as to supply said drive current to said optical element;
    wherein the current control driver comprises:
        a plurality of current mirror circuits corresponding respectively to the signal lines;
        a plurality of first switch circuits which are provided between the current mirror circuits and the signal lines corresponding thereto, respectively, and which are adapted to have a sync-signal input thereto so that the current reduced by the mirror circuits flows in the signal lines;
        a plurality of second switch circuits which supply corresponding gradation signals to the current mirror circuits; and
        a shift register which outputs a signal to the second switch circuits to select the second switch circuits sequentially.

2. The display apparatus according to claim 1, wherein said pixel circuit comprises an active element.

3. The display apparatus according to claim 1, wherein each of said current mirror circuits comprises a capacitor.

4. The display apparatus according to claim 1, wherein each of the first switch circuits comprises a transistor which is intervened between a corresponding one of said current mirror circuits and the corresponding one of said signal lines to allow the reduced current, which is a write current reduced by said predetermined current reduction ratio, to flow in the corresponding signal line at a given timing.

5. The display apparatus according to claim 1, wherein each of the second switch circuits comprises a transistor which is intervened between said shift register and a corresponding one of said current mirror circuits, and which supplies said gradation signal to said corresponding current mirror circuit in accordance with the signal from said shift register.

6. The display apparatus according to claim 1, wherein every transistor in said pixel circuit is an N channel transistor.

7. A display apparatus comprising:
    a plurality of signal lines;
    a plurality of pixels, each of which is connected to one of the plurality of signal lines and comprises an optical element which performs an optical operation based on a value of a drive current flowing therethrough; and
    a current control driver which is connected to an end of each of said plurality of signal lines and which reduces a current value of a gradation signal by a predetermined current reduction ratio such that the reduced write current flows in said signal lines;
    wherein the current control driver comprises:
        a plurality of current mirror circuits corresponding respectively to the signal lines;
        a plurality of first switch circuits which are provided between the current mirror circuits and the signal lines corresponding thereto, respectively, and which are adapted to have a sync-signal input thereto so that the reduced write current flows in the signal lines;
        a plurality of second switch circuits which supply corresponding gradation signals to the current mirror circuits; and a shift resister which outputs a signal to the second switch circuits to select the second switch circuits sequentially.

8. The display apparatus according to claim 7, further comprising a plurality of memory sections, each of which stores a value of a corresponding write current as said write current is allowed to flow inside of said memory section.

9. The display apparatus according to claim 8, wherein each of said plurality of memory sections lets a drive current whose value is equal to said value of said write current into said optical element based on said stored value of said write current.

10. The display apparatus according to claim 8, wherein each of said plurality of memory sections stores said value of said write current by storing charges.

11. The display apparatus according to claim 8, wherein each of said plurality of memory sections comprises a capacitor which stores charges matching said value of said write current.

12. The display apparatus according to claim 8, wherein each of said plurality of memory sections includes:
a capacitor which has a pair of electrodes and stores charges matching said value of said write current; and
a drive transistor having a gate connected to a first one of said pair of electrodes of said capacitor and a source connected to a second one of said pair of electrodes of said capacitor.

13. The display apparatus according to claim 12, wherein said drive transistor is connected in series to said optical element.

14. The display apparatus according to claim 12, wherein each of said plurality of memory sections further comprises:
a data write control transistor which applies a voltage to said gate of said drive transistor in a select period such that said write current flows between said source and a drain of said drive transistor; and
a current path control transistor which applies a potential of said write current flowing in said signal lines to said source of said drive transistor in said select period such that said write current flows between said source and said drain of said drive transistor.

15. The display apparatus according to claim 12, wherein each of said plurality of memory sections further comprises:
a data write control transistor which holds charges stored in said capacitor on a gate side of said drive transistor in a non-select period; and
a current path control transistor which holds charges stored in said capacitor on a source side of said drive transistor in said non-select period.

16. The display apparatus according to claim 7, wherein said optical elements are arranged in a display area and said current control driver is arranged in a non-display area.

17. A display apparatus comprising:
a optical element which has a pair of electrodes and performs an optical operation in accordance with a current flowing between said pair of electrodes;
a first switching element including a control terminal and a current path which has a first end that is connected to a first one of said pair of electrodes of said optical element so that a current with a value corresponding to a voltage between said control terminal and said first end of said current path flows in said current path;
a power supply line which is connected to a second end of said current path of said first switching element and on which a power supply signal for allowing a drive current to flow in said optical element is output;
a scan line on which a scan signal for selecting said optical element is output;
a signal line in which a write current flows from said power supply line via said current path of said first switching element;
a second switching element which controls a voltage to be applied to said control terminal of said first switching element in accordance with said scan signal on said scan line;
a third switching element which controls a current flowing in said signal line in accordance with said scan signal in said scan line;
a capacitor which holds a voltage between said control terminal of said first switching element and said first end of said current path of said first switching element; and
a current control driver which allows said write current, which is obtained by reducing a current value of a gradation signal by a predetermined current reduction ratio, to flow in said signal line;
wherein the current control driver comprises:
a plurality of current mirror circuits corresponding respectively to the signal lines;
a plurality of first switch circuits which are provided between the current mirror circuits and the signal lines corresponding thereto, respectively, and which are adapted to have a sync-signal input thereto so that the write current flows in the signal lines;
a plurality of second switch circuits which supply corresponding gradation signals to the current mirror circuits; and
a shift register which outputs a signal to the second switch circuits to select the second switch circuits sequentially.

18. The display apparatus according to claim 17, wherein said optical element is arranged in a display area and said current control driver is arranged in a non-display area.

19. The display apparatus according to claim 17, wherein said first switching element, said second switching element and said third switching element comprise N channel transistors.

20. A drive method for display apparatus comprising:
providing a plurality of pixels, a plurality of signal lines and a current control driver comprising: (i) a plurality of current mirror circuits which correspond respectively to the signal lines and each of which reduces a current value of an input gradation signal by a predetermined current reduction ratio; (ii) a plurality of first switch circuits which are provided between the current mirror circuits and the signal lines corresponding thereto, respectively, and which are adapted to have a sync-signal input thereto so that the current reduced in the mirror circuits flows in the corresponding signal lines; (iii) a plurality of second switch circuits which supply corresponding gradation signals to the current mirror circuits; and (iv) a shift register which outputs a signal to the second switch circuits to select the second switch circuits sequentially
causing a write current obtained by reducing the current value of the gradation signal by the predetermined current reduction ratio to flow to the plurality of pixels via the plurality of signal lines; and
causing a drive current equal in value to said write current to flow in optical elements of said plurality of pixels.

21. The drive method according to claim 20, wherein the write current is caused to flow to the plurality of pixels via the signal lines by the current control driver.

22. The drive method according to claim 20, wherein the write current is caused to flow to the plurality of pixels by the current control driver without causing the write current to go through said optical elements.

23. The drive method according to claim 20, wherein the drive current is caused to flow in the optical elements by a pixel circuit which has stored said write current.

24. The drive method according to claim 20, wherein said current control driver which allows said write current to flow in said signal lines is arranged in a non-display area.

25. The display apparatus according to claim 1, wherein each of the current mirror circuits comprises a pair of transistors, and each of the second switch circuits comprises a transistor which supplies the gradation signal to gates of the pair of transistors of the corresponding current mirror circuit, and a transistor which supplies the gradation signal to one of a drain and a source of one of the pair of transistors.

26. The display apparatus according to claim 1, wherein each of the current mirror circuits comprises a pair of transistors, and each of the second switch circuits comprises a transistor which supplies the gradation signal to a gate of a first one of the pair of transistors and to one of a drain and a source of the first one of the pair of transistors.

* * * * *